(12) United States Patent
Sugibayashi et al.

(10) Patent No.: US 7,630,234 B2
(45) Date of Patent: Dec. 8, 2009

(54) MAGNETIC RANDOM ACCESS MEMORY

(75) Inventors: Tadahiko Sugibayashi, Tokyo (JP); Takeshi Honda, Tokyo (JP); Noboru Sakimura, Tokyo (JP)

(73) Assignee: NEC Corporation, Tokyo (JP)

( * ) Notice: Subject to any disclaimer, the term of this patent is extended or adjusted under 35 U.S.C. 154(b) by 85 days.

(21) Appl. No.: 12/066,926

(22) PCT Filed: Sep. 7, 2006

(86) PCT No.: PCT/JP2006/317783

§ 371 (c)(1), (2), (4) Date: Mar. 14, 2008

(87) PCT Pub. No.: WO2007/032257

PCT Pub. Date: Mar. 22, 2007

(65) Prior Publication Data

US 2009/0161423 A1    Jun. 25, 2009

(30) Foreign Application Priority Data

Sep. 14, 2005  (JP) .............................. 2005-266998

(51) Int. Cl.
  *G11C 11/14* (2006.01)
(52) U.S. Cl. .................... 365/171; 365/158; 365/189.09
(58) Field of Classification Search ................ 365/158, 365/171, 189.09, 226, 163, 148
See application file for complete search history.

(56) References Cited

U.S. PATENT DOCUMENTS

| 4,782,340 A | * | 11/1988 | Czubatyj et al. .............. 345/92 |
|---|---|---|---|
| 6,333,890 B1 | | 12/2001 | Niimi et al. |
| 6,545,906 B1 | | 4/2003 | Savtcheuko et al. |
| 6,693,824 B2 | * | 2/2004 | Nahas et al. ................. 365/158 |
| 6,744,663 B2 | * | 6/2004 | Garni et al. .................. 365/171 |
| 7,301,829 B2 | * | 11/2007 | Honda et al. ........... 365/189.09 |
| 2004/0001352 A1 | | 1/2004 | Nahas et al. |
| 2004/0008536 A1 | | 1/2004 | Garni et al. |
| 2006/0126377 A1 | | 6/2006 | Honda et al. |

FOREIGN PATENT DOCUMENTS

| JP | 2001-135078 | 5/2001 |
|---|---|---|
| JP | 2003-77267 | 3/2003 |
| JP | 2003-109374 | 4/2003 |
| JP | 2003-331574 | 11/2003 |

(Continued)

*Primary Examiner*—Gene N. Auduong
(74) *Attorney, Agent, or Firm*—Young & Thompson

(57) ABSTRACT

An MRAM having a first cell array group (2-0) and a second cell array group (2-1) containing a plurality of cell arrays (21) is used. Each of the first cell array group (2-0) and the second cell array group (2-1) includes a first current source unit for supplying a first write current IWBL to a bit line WBL of the cell array (21) and a first current waveform shaping unit having a first capacitor requiring precharge and shaping the waveform of the first write current IWBL. When the cell array (21) performs write into a magnetic memory (24), the first current waveform shaping unit of the first cell array group (2-0) and the first current waveform shaping unit of the second cell array group (2-1) charges and discharges electric charge accumulated in the first capacitor to wiring toward the bit line WBL at different periods from each other.

20 Claims, 18 Drawing Sheets

FOREIGN PATENT DOCUMENTS

| | | |
|---|---|---|
| JP | 2003-346473 | 12/2003 |
| JP | 2004-86986 | 3/2004 |
| JP | 2004-234816 | 8/2004 |
| JP | 2004-530240 | 9/2004 |
| WO | WO 2004/003922 | 1/2004 |

* cited by examiner

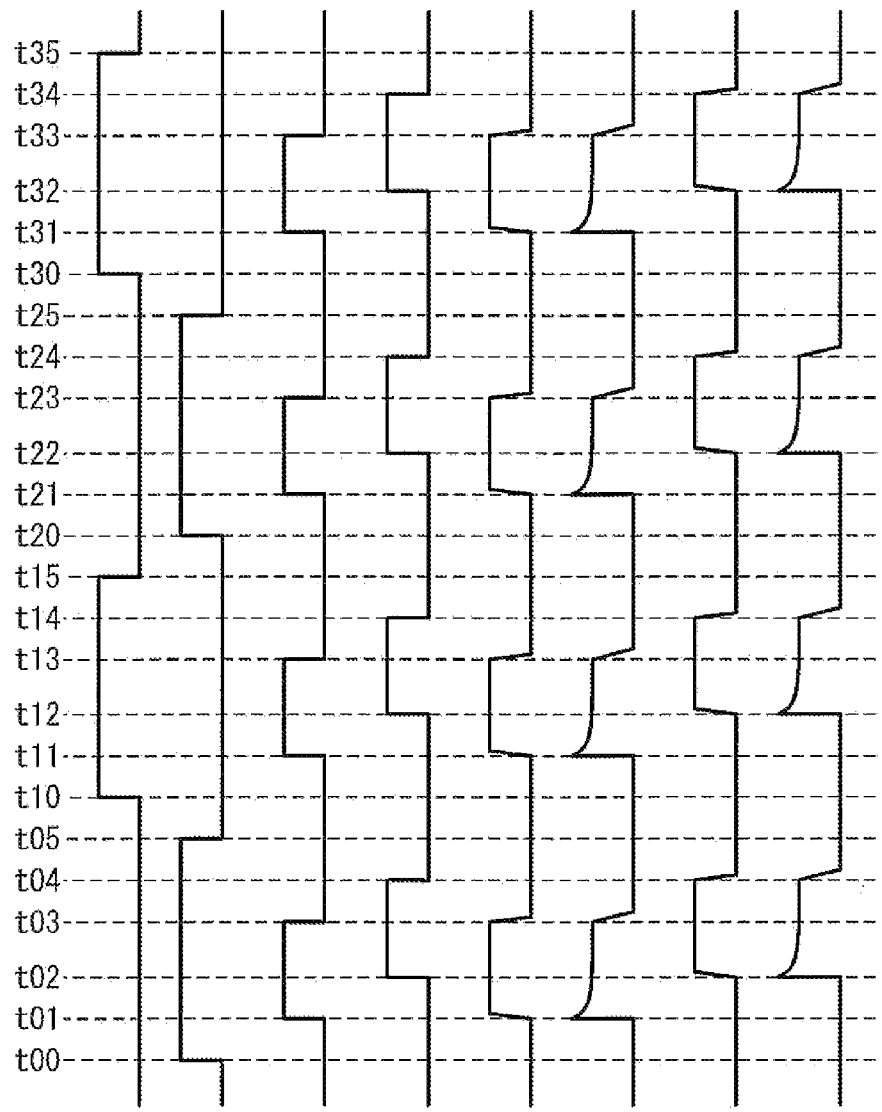

MAGNETIC RANDOM ACCESS MEMORY

TECHNICAL FIELD

The present invention relates to a magnetic random access memory and relates to a magnetic random access memory in which a writing speed is improved.

BACKGROUND ART

A conventional Magnetoresistive Random Access Memory (hereafter, referred to as "MRAM") in which a synthetic ferrimagnet structure is used as a free layer of a tunnel magnetic resistive element (hereafter, referred to as "magnetic resistive element") is disclosed in U.S. Pat. No. 6,545, 906. This MRAM is a so-called toggle MRAM. FIG. 1 is a sectional view showing a structure of the conventional magnetic resistive element 126. The magnetic resistive element 126 is placed between a write word line WWL and a write bit line WBL and away from both of them. The magnetic resistive element 126 includes a free layer 141, a tunnel insulating layer 142, a pinned layer 143 and an anti-ferromagnetic layer 144. The free layer 141 and the pinned layer 143 are formed with the tunnel insulating layer 142 therebetween. The pinned layer 143 is a synthetic ferrimagnet structure in which a non-magnetic layer 155 is sandwiched between a ferromagnetic layer 154 and a ferromagnetic layer 156. A direction of magnetization of the pinned layer 143 is fixed by the anti-ferromagnetic layer 144. The free layer 141 is also a synthetic ferrimagnet structure in which a non-magnetic layer 152 is sandwiched between a ferromagnetic layer 151 and a ferromagnetic layer 153. With the synthetic ferrimagnet structure, unless an external magnetic field is applied, a magnetic field hardly leaks from the pinned layer 143 and the free layer 141.

FIG. 2 is a top view showing the structure of the conventional magnetic resistive element 126. A plurality of write word lines WWL and a plurality of write bit lines WBL are orthogonally arranged. However, here, one write word line WWL and one write bit line WBL are only indicated. The magnetic resistive element 126 is arranged at each of the intersections of the plurality of write word lines WWL and the plurality of write bit lines WBL. As for the magnetic resistive element 126, a direction in which the magnetic resistive element 126 is easily magnetized (magnetization easy axis: indicated by a broken line in the magnetic resistive element 126) is oriented to a direction inclined at 45 degrees with respect to the write word line WWL and the write bit line WBL.

FIG. 3 is a sectional view showing a structure of a memory cell including the conventional magnetic resistive element. A memory cell 124 includes a MOS transistor 127 and the magnetic resistive element 126. The MOS transistor 127 is formed on a substrate 129. The MOS transistor 127 includes, a diffusion layer 127a connected through a contact 133 to a reading bit line RBL; a channel region 127b controlled by a reading word line RWL as a gate; and a diffusion layer 127c connected through a contact 132 to one end of the magnetic resistive element 126. The other end of the magnetic resistive element 126 is connected through a contact 131 to the write bit line WBL. The write word line WWL is laid separately on the lower side of the magnetic resistive element 126. FIG. 4 is an equivalent circuit showing the structure shown in FIG. 3. The magnetic resistive element 126 in the memory cell 124 is a variable resistor in the equivalent circuit. Writing is performed on the magnetic resistive element 126 by the write bit line WBL and the write word line WWL. In t his cell, the reading bit line RBL and the write bit line WBL are separated.

This MRAM 101 is the toggle MRAM. In the case of the memory cell 124 in this toggle MRAM, the writing is carried out only in one case of [1] to [0] and [0] to [1], and [1] cannot be overwritten to [1], and [0] cannot be overwritten to [0]. A writing operation firstly executes a reading operation from the memory cell 124 (hereafter, also referred to as "selected cell") on which the writing operation is performed. Next, when the writing is performed, a write current IWBL is supplied through the write bit line WBL. Subsequently, at a temporal difference, a write current IWWL is supplied through the write word line WWL.

FIG. 5A and FIG. 5B are graphs showing a locus of a write magnetic field induced by a write current. FIG. 5A shows a case of a selected cell (the memory cell 124 selected by a selected write bit line WBL and a selected write word line WWL). FIG. 5B shows a case of a non selected cell (the memory cell 124 connected to any one of the selected write bit line WBL and the selected write word line WWL). As shown in FIG. 5A, when this locus goes round a flop magnetic field, the magnetization of the free layer 141 is changed such as [1] to [0] or [0] to [1]. On the other hand, as shown in FIG. 5B, when this locus does not go round the flop magnetic field, the magnetization of the free layer 141 is not changed. The magnetization of the free layer 141 is saturated when an excessive magnetic field that is equal to or greater than a saturated magnetic field shown on the drawing is applied, and the direction becomes unstable. Thus, there is a necessity that the locus of the write magnetic field is located inside the saturated magnetic field.

FIG. 7 is a block diagram showing a configuration of a conventional MRAM. The MRAM 101 includes a plurality of cell array groups 102-0 to 102-i and a write control signal generating circuit 103. Each of the plurality of cell array groups 102-0 to 102-i is selected by a cell array group selection signal ASEL0 to ASELi from a controller (not shown), respectively. Each of the plurality of cell array groups 102-0 to 102-i includes a plurality of cell array blocks 111-0 to 111-j, a block selector 112, a WL current source 113, a BL current source 114, an AND circuit 115, an XOR circuit 116, a sense amplifier 117 and buffer circuits 118, 119. Incidentally, here, elements related to the reading are omitted except the sense amplifier 117.

The block selector 112 selects each of the plurality of cell array blocks 111-0 to 111-j based on block selection signals BSEL0 to BSELj from the controller (not shown), respectively. The WL current source 113 is the current source for write word lines WWL. The BL current source 114 is the current source for write bit lines WBL. The WL current source 113 and the BL current source 114 are shared in the plurality of cell array blocks 111-0 to 111-j. At the time of a writing operation, a write current IWWL from the WL current source 113 is supplied through a main write word line MWWL to the cell array block 111 selected by the block selector 112. The write current IWBL from the BL current source 114 is supplied through a main write bit line MWBL to the cell array block 111 selected by the block selector 112.

Each of the plurality of cell array blocks 111-0 to 111-j includes: write word lines WWL0 to WWLn; a WL selector 122; write bit lines WBL0 to WBLn, a BL selector 123 and a plurality of memory cells 124. The WL selector 122 selects a selected write word line WWL from the write word lines WWL0 to WWLn by any of word line selection signals XS0 to XSn. The BL selector 123 selects a selected write bit line WBL from the write bit lines WBL0 to WBLn by any of bit line selection signals YS0 to YSn. Each memory cell 124 is provided at each of intersections of the write word lines WWL0 to WWLn and the write bit lines WBL0 to WBLn. At the time of the writing operation, the write current IWWL flows through the write word line WWL selected by the IWWL selector 122. The write current IWBL flows through the write bit line WBL selected by the BL selector 123.

The sense amplifier 117 outputs a read data SAD read from the memory cell 124 to the buffer circuit 119 and the XOR circuit 116. The buffer circuit 118 is selected based on the cell array group selection signal ASEL and stores a write data DIN supplied from outside. Then, at a predetermined timing, the write data DIN is outputted to the XOR circuit 116. The buffer circuit 119 is selected based on the cell array group selection signal ASEL and stores the read data SAD supplied by the sense amplifier 117. Then, at a predetermined timing, the read data SAD is outputted as a read data DOUT to outside. The XOR circuit 116 compares the write data DIN from the buffer circuit 118 and the read data SAD from the sense amplifier 117 and outputs an XOR signal indicating whether or not both are different, to the AND circuit 115. The AND circuit 115, if the write data DIN and the read data SAD are different based on the XOR signal from the XOR circuit 116, outputs a signal M_BSTPR, a signal N_WCSENTX and a signal N_WCSENTY, which are sent from the write control signal generating circuit 103, as a signal BSTER, a signal WCSENTX and a signal WCSENTY to the WL current source 113 and the BL current source 114.

The write control signal generating circuit 103 outputs the signal M_BSTPR, the signal M_WCSENTX and the signal M_WCSENTY to the plurality of cell array groups 102-0 to 102-i. The signal M_BSTPR=the signal BSTPR, the signal M_WCSENTX=the signal WCSENTX and the signal M_WCSENTY=the signal WCSENTY will be described later.

In the case of the writing operation, a reading operation is firstly performed on the memory cell 124. The judgment (toggle judgment) as to Whether or not the output signal SAD of the sense amplifier 117 as the read result and the write data DIN stored in the buffer circuit 118 are different is carried out by the XOR circuit 116. As a result, only if both are different, the toggle write is performed on the memory cell 124. The control of the write timing is shared in the cell array group 102.

FIG. 7A to FIG. 7F are timing charts showing external input waveforms when a burst-mode-operation is performed on the MRAM. FIG. 7A shows a CLK (Clock) signal. FIG. 7B shows an address signal of the memory cell 124. FIG. 7C shows a /ADV (Address Valid Input) signal. FIG. 7D shows a /CE (Chip Enable) signal. FIG. 7E shows a /WE (Write Enable) signal. Those CLK signal, address signal, /ADV signal, /CE signal and /WE signal are the external control signals. FIG. 7F shows an input data signal DIN written to the memory cell 124. Data D0, D1, D2 and D3 as the input data signals DIN are supplied to the buffer circuit 118, synchronously with the CLK signal. After the writing operation is started, the data D0, D1, D2 and D3 are inputted from the third clock. Until it, the data of the memory cell 124 is read for the toggle judgment, in the MRAM 101. Here, the burst mode is the mode at which the continuous writes are performed on the plurality of memory cells 124 on one write word line WWL, while the write bit lines WBL are selected continuously in turn. This may be continuously operated over the different cell array blocks 111. Moreover, this may be continuously operated over the different cell array groups 102.

FIG. 8 is a circuit diagram showing a configuration of a portion through which the write current in FIG. 6 flows. The WL current source 113 is connected to the main write word line MWWL and includes a waveform shaping unit 135, a current source unit 137 and an output control unit 139. The waveform shaping unit 135 includes a switch that is controlled by a capacitor CX and the signal BSTPR. The waveform shaping unit 135 charges parasitic capacitors Cp of a current route (the main write word line MWWL+ the write word line WWL), with charges accumulated in the capacitor CX in the period while the signal BSTPR is LOW. Consequently, rising of a current in the cell array 121 can be improved, thereby shaping the current waveform. The basic content of this technique is disclosed in Japanese Laid-Open Patent Application (JP-P 2004-234816 A). However, the signal BSTPR is shared with a waveform shaping unit 136, which will be described later. Thus, the waveform shaping units 135, 136 carry out the same operation at the same timing. However, the waveform shaping units 135, 136 may be one waveform shaping unit. The current source unit 137 is connected to the main write word line MWWL in parallel to the waveform shaping unit 135. The current source unit 137 supplies the write current IWWL through the main write word line MWWL to the write word line WWL. The output control unit 139 includes an NMOS transistor N1' and an NMOS transistor N1. In the NMOS transistor N1', a source and a drain are connected to the main write word line MWWL, and the signal WCSENX is supplied to a gate. In the NMOS transistor N1, a drain is connected to the main write word line MWWL, a source is connected to a ground, and the signal /WCSENX is supplied to a gate. The output control of the WL current source 113 is carried out by the complementary signals of the signal WCSENX and the signal /WCSENX on the WWL side.

Similarly, the BL current source 114 includes a waveform shaping unit 136 and a current source unit 138 and an output control unit 140. The waveform shaping unit 136 includes a switch that is controlled by a capacitor CY and the signal BSTPR. The waveform shaping unit 136 charges parasitic capacitors Cp of a current route (the main write bit line MWBL+ the write bit line WBL) with charges accumulated in the capacitor CY in the period while the signal BSTPR is LOW. Consequently, rising of a current in the cell array 121 can be improved, thereby shaping the current waveform. The basic content of this technique is disclosed in Japanese Laid-Open Patent Application (JP-P 2004-234816A). The current source unit 138 is connected to the main write bit line MWBL in parallel to the waveform shaping unit 136. The current source unit 138 supplies a write current IWBL through the main write bit line MWBL to the write bit line WBL. The output control unit 140 includes an NMOS transistor N3' and an NMOS transistor N3. In the NMOS transistor N3', a source and a drain are connected to the main write bit line MWBL, and the signal WCSENY is supplied to a gate. In the NMOS transistor N3, a drain is connected to the main write bit line MWBL, and a source is connected to a ground, and the signal / WCSENY is supplied to a gate. The output control of the BL current source 114 is carried out by the complementary signals of the signal WCSENY and the signal /WCSENY on the WBL side.

FIG. 9A to FIG. 9H are timing charts showing waveforms of respective control signals and currents. FIG. 5A shows the signal BSTPR. FIG. 9B shows the signal WCSENX. FIG. 9C shows the signal WCSENY. FIG. 9D shows the write current IWWL oh the write word line WWL. FIG. 9E shows the write current IWWL on the main write word line MWWL, FIG. 5F shows the write current IWBL on the write bit line WBL. FIG. 9G shows the write current IWBL on the main write bit line MWBL. FIG. 5H shows the bit line selection signal YS in the BL selector 123. Here, the word line selection signal XS is omitted.

This timing charts show situations in the third and subsequent clocks of the burst mode in FIG. 7A to FIG. 7F. That is, they show the waveforms in the case that the reading of the data from a first memory cell 124 is already completed, and the toggle write is performed on the memory cell 124, and the toggle write is also performed on the subsequent memory cells 124. Since the parasitic capacitors Cp are charged, the write current IWWL (E) of the main write word line MWWL and the write current IWBL (G) of the main write bit line MWBL have overshoots when the currents rise. However, the write current IWWL (D) of the write word line WWL inside the cell array 121 and the write current IWBL (F) of the write bit line WBL inside the cell array 121 have no overshoot when the currents rise, and they can rise rapidly.

With reference to FIG. 8 and FIG. 9A to FIG. 9H, the writing operation of the burst mode will be described. Here, the write word line WWL0 of the cell array block 111-0 will be described.

(1) t00

Among the memory cells on the write word line WWL0, the memory cell 124 on which the toggle write should be performed is already determined, based on the reading operation carried out immediately before the toggle write. Here, the case when the toggle write is performed on all of the memory cells 124 is described. When the last signal BSTPR is Low, the capacitors CX and CY are charged. At the time t00, the signal BSTPR becomes High (A), and the discharging of the charges accumulated in the capacitors CX and CY is started. The wirings from the waveform shaping unit 135 to the output control unit 139 and from the waveform shaping unit 136 to the output control unit 140 are charged. At this time, the block selection signal BSEL0 becomes High (hot shown), and the cell array block 111-0 is selected by the block selector 112. The signal XS0 becomes High (not shown), and the write word line WWL0 is selected by the WL selector 122. The signal YS0 becomes High (H), and the write bit line WBL0 is selected by the BL selector 123.

(2) t01

The signal WCSENX becomes High (B), and the remainder of the charges accumulated in the capacitor CX charges the main write word line MWWL and the write word line WWL0. Together with it, the write current IWWL is supplied from the current source unit 137 to the main write word line MWWL and the write word line WWL0 ((E), (D)). With this charging, the rising of the write current IWWL can be improved, thereby shaping the current waveform.

(3) t02

The signal WCSENY becomes High (C), and the remainder of the charges accumulated in the capacitor CY charges the main write bit line MWBL and the write bit line WBL0. Together with it, the write current IWBL is supplied from the current source unit 138 to the main write bit line MWBL and the write bit line WBL0 ((G), (F)). With this charging, the rising of the write current IWBL can be improved, thereby shaping the current waveform.

(4) t03

The signal WCSENX becomes Low (B), and the write current IWWL from the current source unit 137 to the main write word line MWWL and the write word line WWL0 is stopped ((E), (D)).

(5) t04

The signal WCSENY becomes Low (C), and the write current IWBL from the current source unit 138 to the main write bit line MWBL and the write bit line WBL0 is stopped ((G), (F)). Since this write current IWWL and the write current IWBL are supplied at a temporal difference, the toggle write can be performed on the selection cell 124.

(6) t05

At the time t05, the signal BSTPR becomes Low (A), and the charges begin to be accumulated in the capacitors CX and CY. Because of the writing operation of the burst mode, until the completion of the writing to the memory cells 124 in a predetermined range, the block selection signal BSEL0 is kept High (not shown), and the cell array block 111-0 is still selected by the block selector 112. Until the execution of the writing to all of the memory cells 124 on the write word line WWL0, the signal. XS0 is kept High (not shown), and the write word line WWL0 is still selected by the WL selector 122. The signal YS0 becomes Low (H). Then, the selection of the write bit line WBL0 by the BL selector 123 is completed.

Hereafter, the similar processes are repeated.

However, at the burst mode, although the write word line WWL is switched in turn and the writing is executed, at that time, the bit line selection signal supplied to the switch in the BL selector 123 is switched such as YS0 to YS1 to YS2 to YS3. As for this switching period, for example, as for the period from the time t05 to the time t10, a certain period or more its required. The reason why the certain period of time is required is that the capacitor CY in the waveform shaping unit 136 cannot be charged if there is no period of the signal BSTPR with the Low level. Moreover, the charges that are charged in the parasitic capacitors Cp in the main write bit line MWBL and the write bit line WBL are required to be sufficiently discharged through the NMOS transistor N3 to which the signal /WCSENY is supplied within the period that the signal WCSENY is Low. If those charging and discharging are not sufficiently, the shaping of the waveform does not satisfy the design, and an erroneous operation is brought about.

FIG. 10 is a block diagram showing one example of a configuration of the write control signal generating circuit 103. Five sets of a delay element 161 and an AND gate are connected in series. One input of each AND gate is the opposite signal to a signal CLR. The other input is a signal SET or the output of the set of the former stage. The signal SET and the opposite signal of the output of the set of the fifth stage become the inputs of another AND gate, and its output is a signal M_BSTPR. The output of the set of the first stage and the opposite signal of the output of the set of the third stage become the inputs of another AND gate, and its output is the signal M_WCSENX. The output of the set of the second stage and the opposite signal of the output of the set of the fourth stage become the inputs of another AND gate, and its output is the signal M_WCSENY.

FIG. 11A to FIG. 11F are timing charts showing waveforms of respective control signals outputted by the write control signal generating circuit 103. The write control signal generating circuit 103 outputs one shot pulse that is generated by the delay element 161 and the AND gate. After the pulse is outputted, the delay element 161 is required to be reset. On the timing chart, the signal CLR resets the delay element 161. Because of the point that this reset is required in the write control signal generating circuit 103, it is difficult to continuously output the signal BSTPR, the signal M_WCSENX and the signal M_WCSENY at a short interval.

As mentioned above, since the certain period is required in order to switch the bit line selection signal YS and since the reset time is required when the control signals (the signal BSTPR, the signal M_WCSENX and the signal M_WCSENY) related to the writing are generated, it is difficult to carry out the writing operation at the higher speed. That is, the waveform shaping unit is essentially required in order to make the waveform suitable. However, this is not suitable for the write mode of the high speed because of the operation performance. A technique is desired which can carry out the writing operation in the MRAM having the waveform shaping unit at the high speed.

Japanese Laid-Open Patent Application (JP-P 2004-234816A) discloses a semiconductor storage device. This semiconductor storage device includes: a storage element for storing information; a constant current source that is installed to write the information to the storage element by supplying a current; and a boosting circuit for charging a parasitic capacitor until the amount of the current that is supplied by the constant current source at a predetermined position related to the storage element arrives at the amount of the current required to write the information to the storage element.

Japanese Laid-Open Patent Application (JP-P 2003-109374A) describes a writing circuit of a magnetic memory device. The writing circuit of this magnetic memory device has a magnetic resistive element, to which information is written correspondingly to a magnetic field excited by a pulse-shaped current, for each memory cell. In this writing circuit, a current generator for generating the pulse-shaped current increases the current supply ability at plurality of stages when the pulse-shaped current is started up.

Japanese Laid-Open Patent Application (JP-P 2003-331574A) discloses a magnetic random access memory. The writing method of this magnetic random access memory applies, to a magnetic resistive effect element having an easy axis and a hard axis, a first magnetic field parallel to the hard axis and then applies a second magnetic field parallel to the hard axis that is weaker than the first magnetic field, and a third magnetic field parallel to the easy axis to the magnetic resistive effect element, at the same time.

DISCLOSURE OF INVENTION

An object of the present invention is to provide MRAM that can carry out the writing operation at the higher speed by using the waveform shaping unit.

This and other objects, features and advantages of the present invention will be readily ascertained by referring to the following description and drawings.

In order to solve the above-mentioned subjects, a magnetic random access memory of the present invention includes: a first cell array group including a plurality of cell arrays; and a second cell array group including a plurality of cell arrays. Each of the first cell array group and the second cell array group includes a first current source unit supplying a first write current to a bit line of each of the plurality of cell arrays and a first current waveform shaping unit including a first capacitor required to be pre-charged and shaping a waveform of the first write current. At a time of a writing operation of a magnetic memory cell in each cell array, the first current waveform shaping unit in the first cell array group and the first current waveform shaping unit in the second cell array group charge and discharge charges accumulated in the first capacitor to and from a wiring towards the bit line in periods different from each other.

In the magnetic random access memory, each of the first cell array group and the second cell array group further includes a second current source unit supplying a second write current to a word line of each cell array and a second current waveform shaping unit including a second capacitor required to be pre-charged and shaping a waveform of the second write current. At the time of the writing operation of the magnetic memory cell, the second current waveform shaping unit in the first cell array group and the second current waveform shaping unit in the second cell array group charge and discharge charges accumulated in the second capacitor to and from a wiring towards the bit line in periods different from each other.

In order to solve the foregoing subjects, the magnetic random access memory of the present invention includes a first current source unit, a first current waveform shaping unit, a second current source unit and a second current waveform shaping unit. The first current source unit is shared in a plurality of cell arrays and supplies a first write current to each bit line in the plurality of cell arrays. The first current waveform shaping unit includes a first capacitor required to be pre-charged and shapes a waveform of the first write current. The second current source unit is shared in the plurality of cell arrays and supplies a second current to each word line in the plurality of cell arrays. The second current waveform shaping unit includes a second capacitor required to be pre-charged and shapes a waveform of the second write current. At a time of a writing operation of a magnetic memory cell, a period while the first current waveform shaping unit carries out charging and discharging to and from the first capacitor for a wiring towards the bit line and a period while the second current waveform shaping unit carries out charging and discharging to and from the second capacitor for a wiring towards the word line are different from each other.

In order to solve the foregoing subjects, the magnetic random access memory of the present invention includes the first current source unit, the first current waveform shaping unit and a third current waveform shaping unit. The first current source unit is shared in a plurality of cell arrays and supplies a first write current to each bit line in the plurality of cell arrays. The first current waveform shaping unit includes a first capacitor required to be pre-charged and shapes a waveform of the first write current. The third current waveform shaping unit includes a third capacitor required to be pre-charged and shapes a waveform of the first write current. At a time of a writing operation of a magnetic memory cell in each cell array, a period while the first current waveform shaping unit charges and discharges charges accumulated in the first capacitor to and from the wiring towards the bit line and a period while the third current waveform shaping unit charges and discharges charges accumulated in the third capacitor to and from a wiring towards the bit line are different from each other.

The foregoing magnetic random access memory of the present invention further includes a second current source unit, a second current waveform shaping unit and a fourth current waveform shaping unit. The second current source unit is shared in the plurality of cell arrays and supplies the second write current to each word line; in the plurality of cell arrays. The second current waveform shaping unit includes a second capacitor required to be pre-charged and shapes a waveform of the second write current. The fourth current waveform shaping unit includes a fourth capacitor required to be pre-charged and shapes a waveform of the second write current. At the time of the writing operation of the magnetic memory cell in each cell array, a period while the second current waveform shaping unit charges and discharges charges accumulated in the second capacitor to and from a wiring towards the word line and a period while the fourth current waveform shaping unit charges and discharges charges accumulated in the fourth capacitor to and from a wiring towards the word line are different from each other.

In the foregoing magnetic random access memory, the magnetic memory cell includes a free layer with a synthetic ferrimagnet structure. The magnetization easy axis direction of the free layer is inclined at about 45 degrees for the direction of the bit line.

In order to solve the foregoing subjects, the present invention is an operating method of a magnetic random access memory. Here, the magnetic random access memory includes a first cell array group including a plurality of cell arrays and a second cell array group including a plurality of cell arrays. Each of the first cell array group and the second cell array group includes a first current source unit supplying a first write current to a bit line of each of the plurality of cell arrays and a first current waveform shaping unit including a first capacitor required to be pre-charged and shaping a waveform of the first write current. The operating method of the magnetic random access memory includes: (a) at a time of a writing operation of the magnetic memory cell in each cell array, the first current waveform shaping unit in the first cell array group discharging charges accumulated in the first capacitor to a wiring towards the bit line in a first period; and (b) the first current waveform shaping unit in the second cell array group discharging charges accumulated in the first capacitor to a wiring towards the bit line in a second period different from the first period.

In the operating method of the magnetic random access memory, in the magnetic random access memory, each of the first cell array group and the second cell array group further includes a second current source unit supplying a second write current to the word line of each cell array and a second current waveform shaping unit including a second capacitor required to be pre-charged and shaping a waveform of the second write current. The operating method of the magnetic random access memory includes, (c) at the time of the writing operation of the magnetic memory cell, the second current waveform shaping unit in the first cell array group discharging charges accumulated in the second capacitor to a wiring towards the word line in a third period; and (d) the second current waveform shaping unit in the second cell array group discharging charges accumulated in the second capacitor to a wiring towards the word line in a fourth period different from the third period.

In order to solve the foregoing subjects, the present invention is an operating method of a magnetic random access memory. Here, the magnetic random access memory includes a first current source unit, a first current waveform shaping unit, a second current source unit and a second current waveform shaping unit. The first current source unit is shared in a plurality of cell arrays and supplies a first write current to each bit line in the plurality of cell arrays. The first current waveform shaping unit includes a first capacitor required to be pre-charged and shapes a waveform of the first write current. The second current source unit is shared in the plurality of cell arrays and supplies a second write current to each word line in the plurality of cell arrays. The second current waveform shaping unit includes a second capacitor required to be pre-charged and shapes a waveform of the second write current. The operating method of the magnetic random access memory includes: (a) at a time of a writing operation of a magnetic memory cell, the first current waveform shaping unit discharging charges accumulated in the first capacitor in a first period to a wiring towards the bit line; and (b) the second current waveform shaping unit discharging charges accumulated in the second capacitor in a second period different from the first period to a wiring towards the bit line.

In order to solve the foregoing subjects, the present invention is an operating method of a magnetic random access memory. Here, the magnetic random access memory includes a first current source unit, a first current waveform shaping unit and a third current waveform shaping unit. The first current source unit is shared in a plurality of cell arrays and supplies a first write current to each bit line in the plurality of cell arrays. The first current waveform shaping unit includes a first capacitor required to be pre-charged and shapes a waveform of the first write current. The third current waveform shaping unit includes a third capacitor required to be pre-charged and shapes a waveform of the first write current. The operating method of the magnetic random access memory includes: (a) at a time of a writing operation of a magnetic memory cell in each cell array, the first current waveform shaping unit discharging charges accumulated in the first capacitor in a first period to a wiring towards the bit line; and (b) the third current waveform shaping unit discharging charges accumulated in the third capacitor to a wiring towards the bit line in a third period different from the first period.

In the operating method of the magnetic random access memory, the magnetic random access memory further includes a second current source unit, a second current waveform shaping unit and a fourth current waveform shaping unit. The second current source unit is shared in the plurality of cell arrays and supplies a second write current to each word line in the plurality of cell arrays. The second current waveform shaping unit includes a second capacitor required to be pre-charged and shapes a waveform of the second write current. The fourth current waveform shaping unit includes a fourth capacitor required to be pre-charged and shapes a waveform of the second write current. The operating method of the magnetic random access memory further includes: (a) at the time of the writing operation of the magnetic memory cell in each cell array, the second current waveform shaping unit discharging charges accumulated in the second capacitor in a second period to a wiring towards the word line; and (b) the fourth current waveform shaping unit discharging charges accumulated in the fourth capacitor to a wiring towards the word line in a fourth period different from the second period.

In the operating method of the foregoing magnetic random access memory, the writing operation of the magnetic memory cell is the toggle write operation.

According to the present invention, the writing operation using the waveform shaping unit in the MRAM can bet carried out at the higher speed.

BRIEF DESCRIPTION OF THE DRAWINGS

FIG. 18A to FIG. 18H are timing charts showing waveforms of control signals and currents.

BEST MODE FOR CARRYING OUT THE INVENTION

Exemplary embodiments in a MRAM according to the present invention will be described below with reference to the attached drawings.

First Exemplary Embodiment

Figure 12:
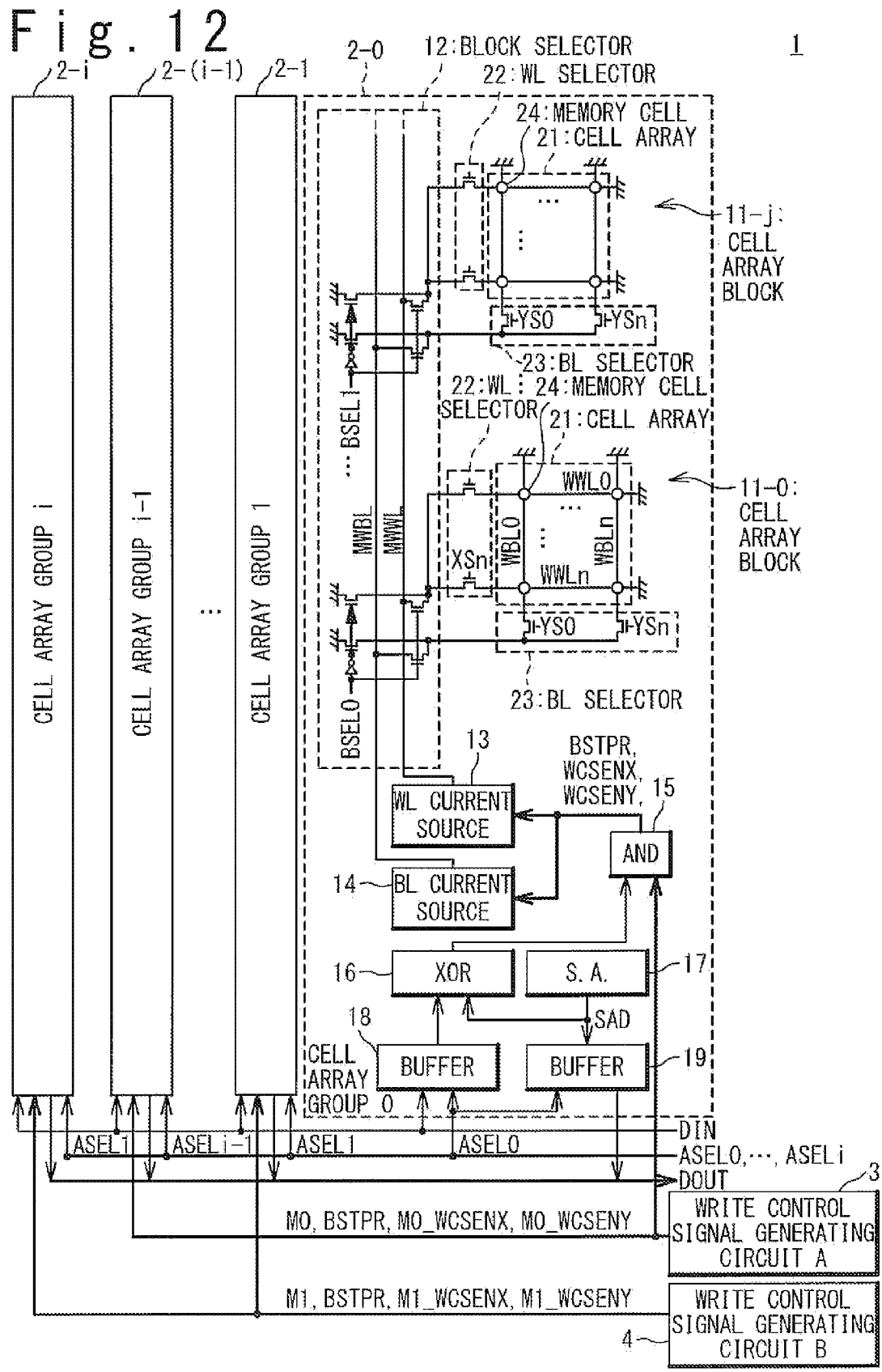
FIG. 12 is a block diagram showing a configuration of a MRAM according to a first exemplary embodiment of the present invention.

A configuration of a MRAM according to a first exemplary embodiment of the present invention will be described below. FIG. 12 is a block diagram showing a configuration of a MRAM according to the first exemplary embodiment in of the present invention. A MRAM 1 includes a plurality of cell array groups 2-0 to 2-i, a write control signal generating circuit A 3 and a write control signal generating circuit B 4. Each of the plurality of cell array groups 2-0 to 2-i is selected based on corresponding one of cell array group selection signals ASEL0 to ASELi tram a controller (not shown). Each of the plurality of cell array groups 2-0 to 2-i includes a plurality of cell array blocks 11-0 to 11-j, a block selector 12, a WL current source 13, a BL current source 14, an AND circuit 15, an XOR circuit 16, a sense amplifier 17, buffer circuits 18, 19. Incidentally, here, elements related to the reading are omitted except the sense amplifier 17.

The block selector 12 selects each of the plurality of cell array blocks 11-0 to 11-j based on corresponding one of block selection signals BSEL0 to BSELj from the controller (not shown). The WL current source 13 is a current source for a write word line WWL. The BL current source 14 is a current source for a write bit line WBL. The WL current source 13 and the BL current source 14 are shared in the plurality of cell array blocks 11-0 to 11-j. At a time of a writing operation, a write current IWWL from the WL current source 13 is supplied through a main write word line MWWL to a cell array block 11 selected by the block selector 12. A write current IWBL from the BL current source 14 is supplied through a main write bit line MWBL to the cell array block 11 selected by the block selector 12.

Each of the plurality of cell array blocks 11-0 to 11-j includes write word lines WWL0 to WWLn, a WL selector 22, write bit lines WBL0 to WBLn, a BL selector 23, a plurality of memory cells 24. The WL selector 22 selects a selected write word line WWL from the write word lines WWL0 to WWLn based on one of word line selection signals XS0 to XSn. The BL selector 23 selects a selected write bit line WBL from the write bit lines WBL0 to WBLn based on one of bit line selection signals YS0 to YSn. The plurality of memory cells 24 is arranged at intersections of the write word lines WWL0 to WWLn and the write bit lines WBL0 to WBLn. At the time of the writing operation, the write current IWWL flows through the write word line WWL selected by the WL selector 22. The write current IWBL flows through the write bit line WBL selected by the DL selector 23.

The sense amplifier 17 outputs a read data SAD, which is read from the memory cell 24, to the buffer circuit 19 and the XOR circuit 16. The buffer circuit 18 is selected based on the cell array group selection signal ASEL and stores a write data DIN supplied from outside. Then, at a predetermined timing, the write data DIN is outputted to the XOR circuit 16. The buffer circuit 19 is selected based on the cell array group selection signal ASEL and stores the read data SAD supplied from the sense amplifier 17. Then, at a predetermined timing, the read data SAD is outputted as a read data DOU to outside. The XOR circuit 16 compares the write data DIN from the buffer circuit 18 with the read data SAD from the sense amplifier 17 and outputs an XOR signal indicating whether or not both are different from each other to the AND circuit 15. The AND circuit 15 has functions that are different between a case when the AND circuit 15 is included in any of the (even-numbered) cell array groups 2-0, 2-2, - - - and 2-(i−1) and a case when the AND circuit 15 is included in the (odd-numbered) cell array groups 2-1, 2-3, - - - and 2-i. That is, if the AND circuit 15 is included in the even-numbered cell array group 2, the AND circuit 15 outputs a signal M0_BSTPR, a signal M0_WCSENTX and a signal M0_WCSENTY from the write control signal generating circuit A 3 as a signal BSTPR, a signal WCSENTX and a signal WCSENTY to the WL current source 13 and the BL current source 14, when the write data DIN and the read data SAD are different from each other based on the XOR signal from the XOR circuit 16. If the AND circuit 15 is included in the odd-numbered cell array group 2, the AND circuit 15 outputs a signal M1_BSTPR, a signal M1_WCSENTX and a signal M1_WCSENTY from the write control signal generating circuit B 4 as the signal BSTPR, the signal WCSENTX and the signal WCSENTY to the WL current source 13 and the BL current source 14, when the write data DIN and the read data SAD are different from each other based on the XOR signal from the XOR circuit 16.

The write control signal generating circuit A 3 outputs the signal M0_BSTPR, the signal M0_WCSENTX and the signal M0_WCSENTY, to the plurality of even-numbered cell array groups 2-0, 2-2, - - - , and 2(i−1). The write control signal generating circuit B 4 outputs the signal M1_BSTPR, the signal M1_WCSENTX and the signal M1_WCSENTY, to the plurality of odd-numbered cell array groups 2-1, 2-3, - - - , and 2-i. The signal M0_BSTPR=the signal M1_BSTPR=the signal BSTPR, the signal M0_WCSENTX=the signal M1_WCSENTX=the signal WCSENTX, and the signal M0_WCSENTY=the signal M1_WCSENTY=the signal WCSENTY will be described later. The write control signal generating circuit A 3 and the write control signal generating circuit B 4 may be integrated into one unit.

In the writing operation, the reading operation is firstly performed on the selected memory cell 24. The judgment (toggle judgment) as to whether or not the output signal SAD of the sense amplifier 17 as the read, result and the write data DIN stored in the buffer circuit 18 are different from each other is carried out by the XOR circuit 16. As a result, only if both are different from each other, the toggle write is performed on the selected memory cell 24. The control of the write timing is shared in the cell array group 2.

In the present invention, the two write control signal generating circuits (A 3, B 4) are used, and the write control signals are outputted to two systems (the signal M0_BSTPR, the signal M0_WCSENX and the signal M0_WCSENY, and the signal M1_BSTPR, the signal M1_WCSENX and the signal M1_WCSENY). In association with it, the cell array groups 2 are also divided into two systems, and the write control signal is supplied to each system.

Figure 8:
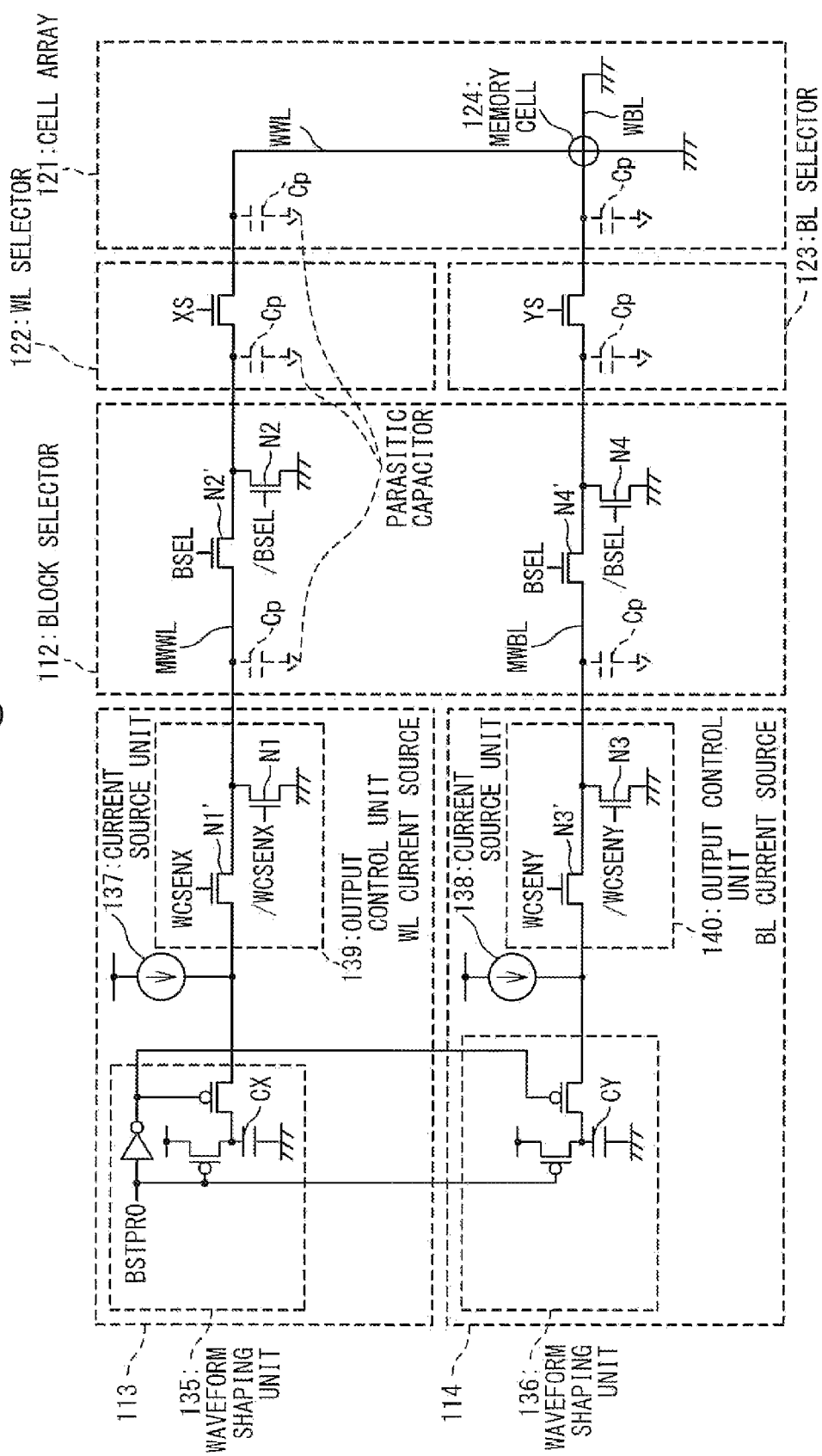
FIG. 8 is a circuit diagram showing a configuration of a portion through which a write current in FIG. 6 flows.
Figure 9:
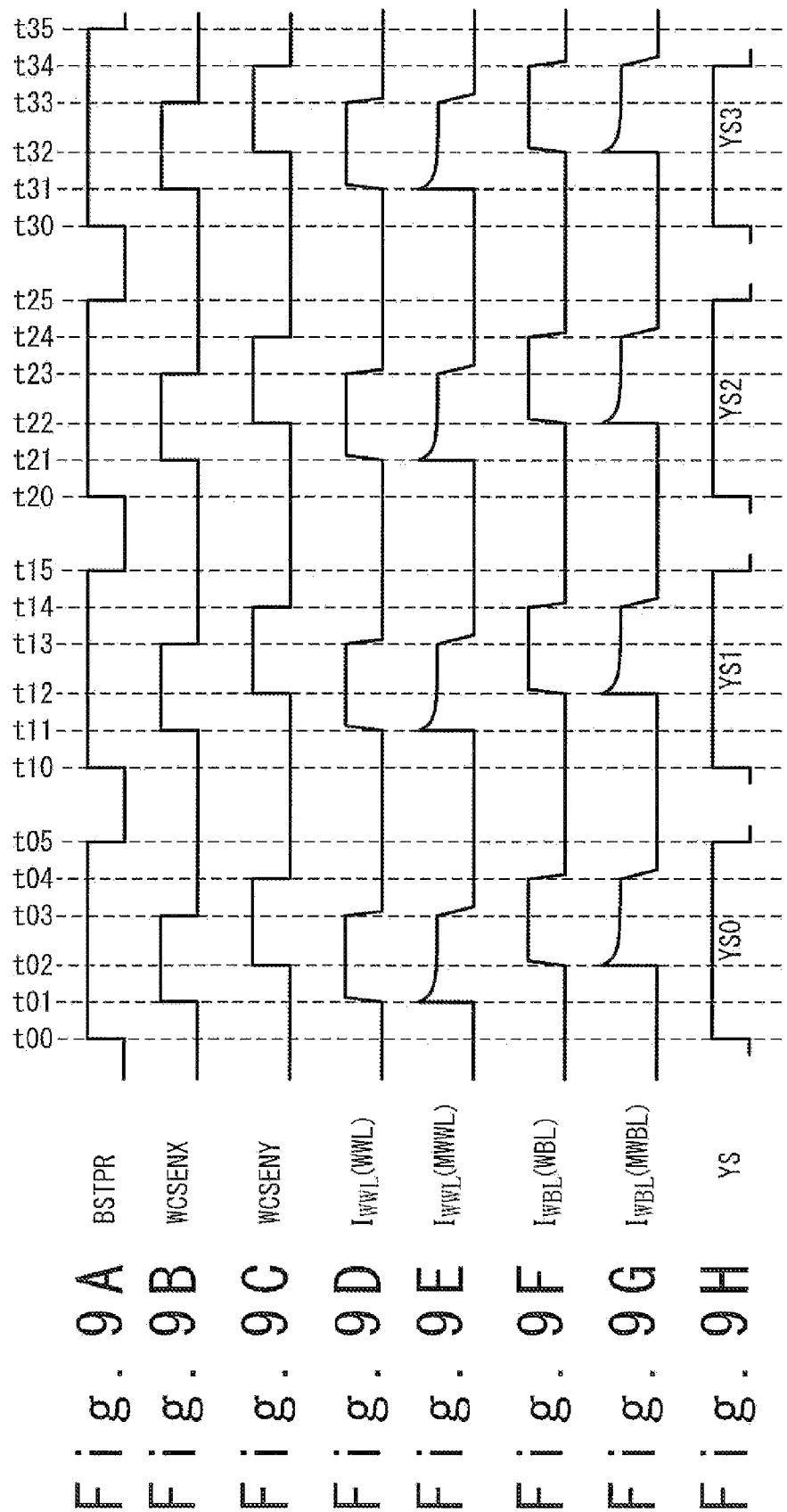
FIG. 9A to FIG. 9H are timing charts showing waveforms of control signals and currents.
Figure 10:
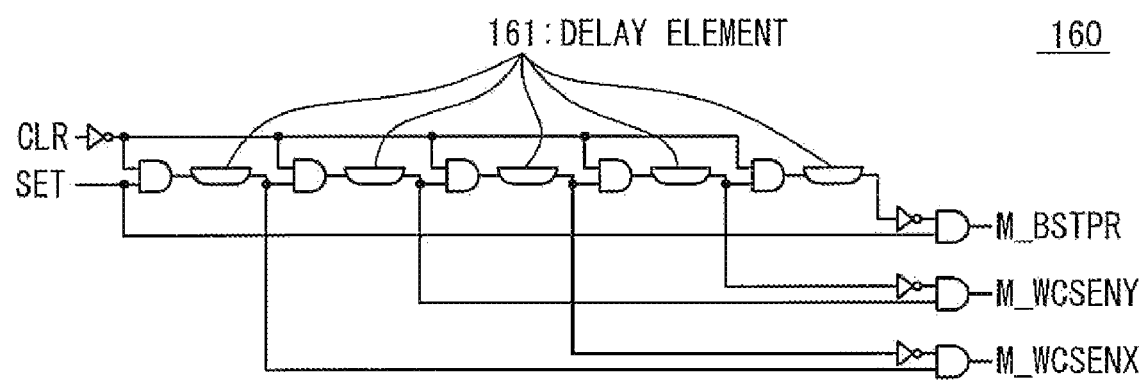
FIG. 10 is a block diagram showing one example of a configuration of a write control signal generating circuit.
Figure 11:
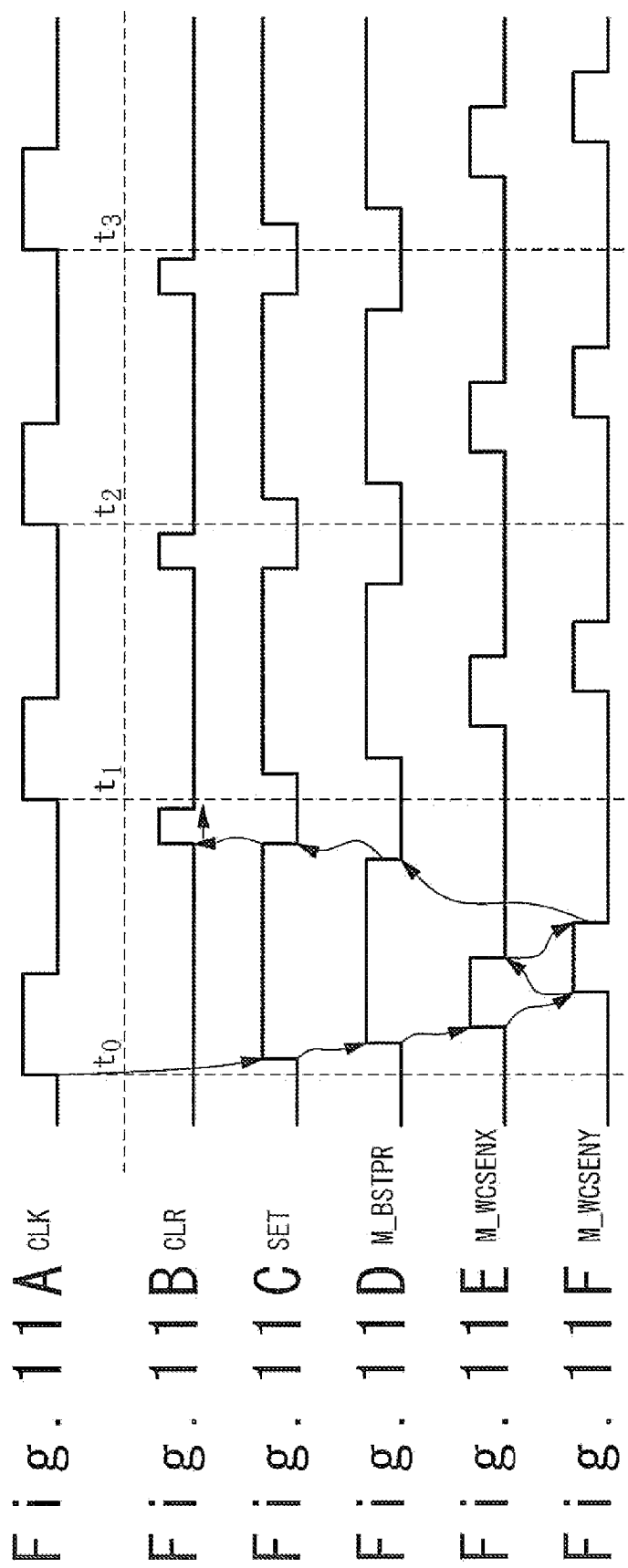
FIG. 11A to FIG. 11F are timing charts showing waveforms of control signals outputted by the write control signal generating circuit.

In the WL current source 13 and the BL current source 14, their configurations and functions are equal to those of the WL current source 113 and the BL current source 114 described with reference to FIG. 8. Thus, the descriptions of the WL current source 13 and the BL current source 14 are omitted.

In the write control signal generating circuit A 3 and the write control signal generating circuit B 4, their configurations and functions and their control signals are equal to those of the write control signal generating circuit 103 described with reference to FIG. 10 and FIG. 11A to FIG. 11F. Thus, the descriptions of the write control signal generating circuit A 3 and the write control signal generating circuit B 4 are omitted.

Figure 13:
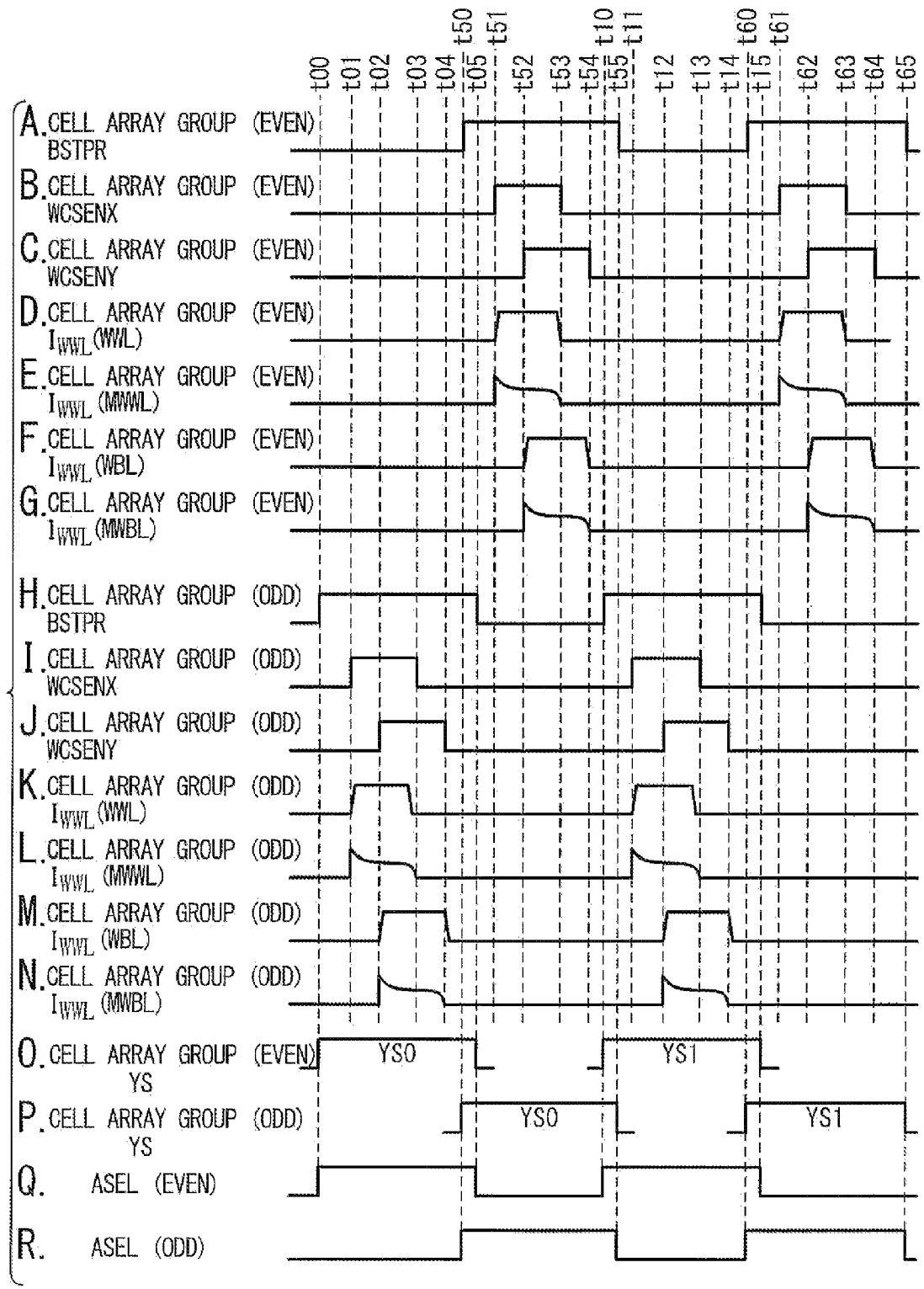
FIG. 13A to FIG. 13R are timing charts showing waveforms of control signals and currents.

FIG. 13A to FIG. 13R are timing charts showing waveforms of respective control signals and currents. FIG. 13A to FIG. 13G, and FIG. 13O and FIG. 13Q relate to the even-numbered cell array groups 2. FIG. 13H to FIG. 13N and FIG. 13P and FIG. 13R relate to the odd-numbered cell array groups 2. FIG. 13A and FIG. 13H indicate the signal BSTPR. FIG. 13B and FIG. 13I indicate the signal WCSENX. FIG. 13C and FIG. 13J indicate the signal WCSENY. FIG. 13D and FIG. 13K indicate the write current IWWL on the write word line WWL. FIG. 13E and FIG. 13L indicate the write current IWWL on the main write word line MWWL. FIG. 13F and FIG. 13M indicate the write current IWBL on the write bit line WBL. FIG. 13G and FIG. 13N indicate the write current IWBL on the main write bit line MWBL. FIG. 13O and FIG. 13P indicate the bit line selection signal YS in the BL selector 23. FIG. 13Q and FIG. 13R indicate the cell array group selection signal ASEL. Here, the word line selection signal Xs is omitted.

These timing charts show situations in the third and subsequent clocks of the burst mode in FIG. 7A to FIG. 7F. Since parasitic capacitors Cp are charged, the write current IWWL (FIG. 13E, FIG. 13L) of the main write word line MWWL and the write current IWBL (FIG. 13G, FIG. 13N) of the main write bit line MWBL have the overshoots when the currents rise. However, the write current IWWL (FIG. 13D, FIG. 13K) of the write word line WWL and the write current IWBL (FIG. 13F, FIG. 13M) of the write bit line WBL inside the cell array 21 have no overshoot when the currents rise, and they can rise rapidly.

Here, the writing operation of the burst mode inside each cell array group 2 is similar to the writing operation of the conventional burst mode described with references to FIG. 8 and FIG. 9A to FIG. 9H. In this exemplary embodiment, the writing operation of the burst mode is performed on the odd-numbered cell array groups 2 (the cell array groups 2-1, 2-3, - - - ) at the times t00 to t05 (FIG. 13H to FIG. 13N, FIG. 13P and FIG. 13R). Next, the writing operation of the burst mode is performed on the even-numbered cell array groups 2 (the cell array groups 2-0, 2-2, - - - ) at the times t50 to t55 (FIG. 13A to FIG. 13G and FIG. 13O and FIG. 13Q). Here, the time t50 is set at the time earlier than the time t05. Similarly, next, at the times t10 to t15, the writing operation of the burst mode is performed on the odd-numbered cell array groups 2. Here, the time t10 is set at the time earlier than the time t55. That is, the cell array groups 2 of the two systems execute the mutual toggle write operations while they are partially overlapped.

In this way, during the burst write mode, each of the cell array groups 2 of the two systems (the even-numbered cell array group 2 and the odd-numbered cell array group 2) is alternately selected. Consequently, even if the BSTPR of the even-numbered cell array group 2 at the 0-th clock (the time t00) (FIG. 13H) and the BSTPR of the odd-numbered cell array group 2 at the first clock (the time t50) are made close to each other until they are slightly overlapped, the period when the pre-charge signal BSTPR is Low can be sufficiently secured. Thus, the capacitor CY in the waveform shaping unit can be sufficiently charged.

As for the signal WCSENX (FIG. 13B, FIG. 13I) and the signal WCSENY (FIG. 13C, FIG. 13J), the intervals between this time and next time of the respective signal WCSENX and the signal WCSENY can be made sufficient. Consequently, the main write bit line MWBL and the write bit line WBL can be sufficiently discharged through the NMOS transistor N3.

Since the interval between the signals WCSENX and the interval between the signals WCSENY can be set sufficient, a sufficient time can be given to the reset of the delay elements inside the write control signal generating circuit A 3 and the write control signal generating circuit B 4. In this way, when the cell array group 2 is divided into the plurality of systems, namely, divided into two or more systems, the similar effect can be obtained. As the number of the divisions is increased, the larger effect can be obtained.

According to the present invention, the waveform shaping unit can be used to carry out the writing operation at the higher speed.

Second Exemplary Embodiment

Figure 6:
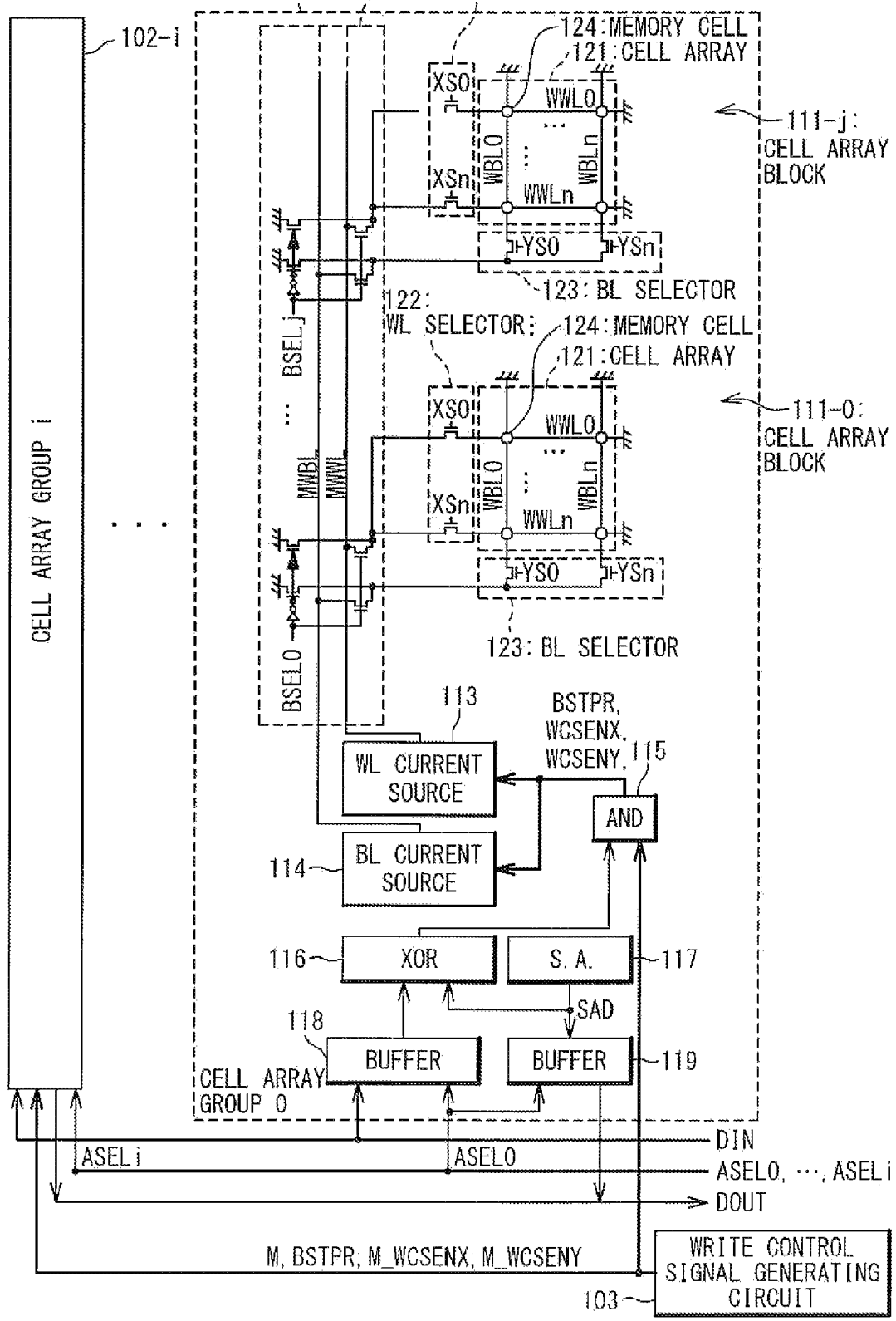
FIG. 6 is a block diagram showing a configuration of the conventional MRAM.
Figure 7:
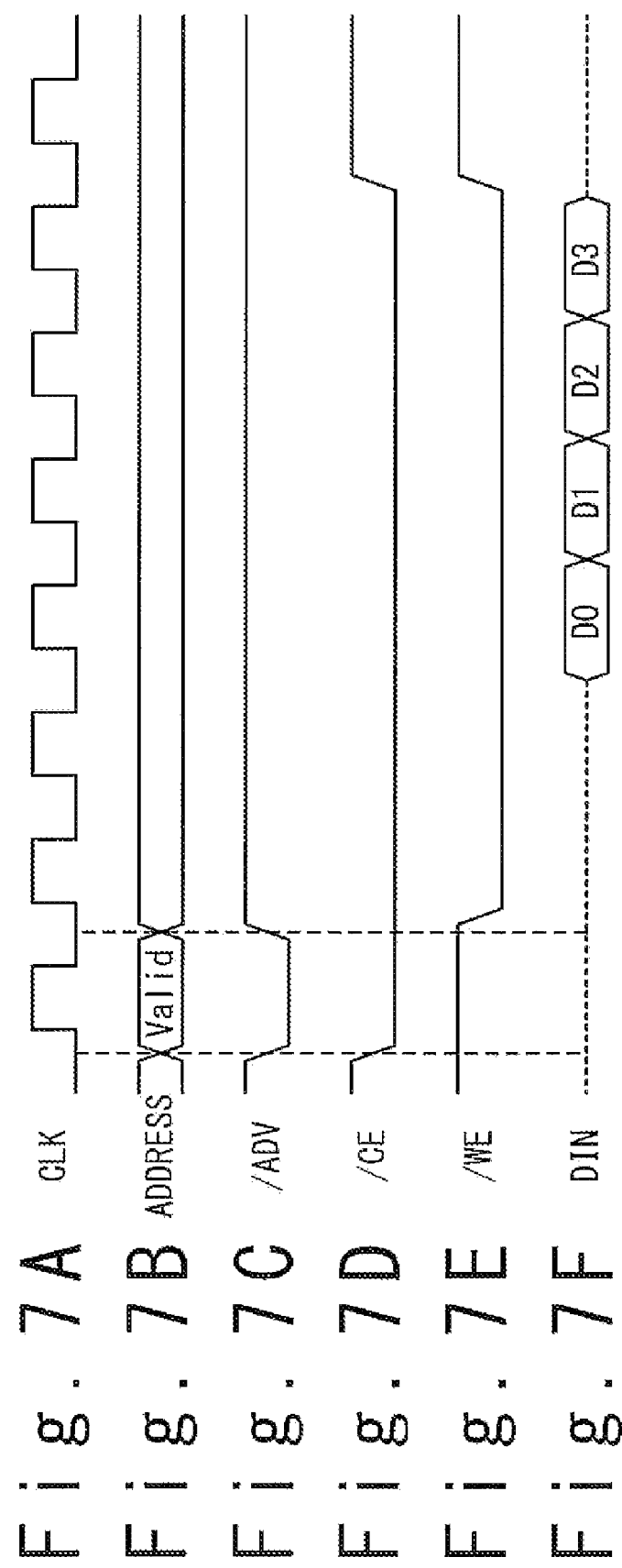
FIG. 7A to FIG. 7F are timing charts showing external input waveforms when the conventional MRAM is burst-mode-operated.
Figure 14:
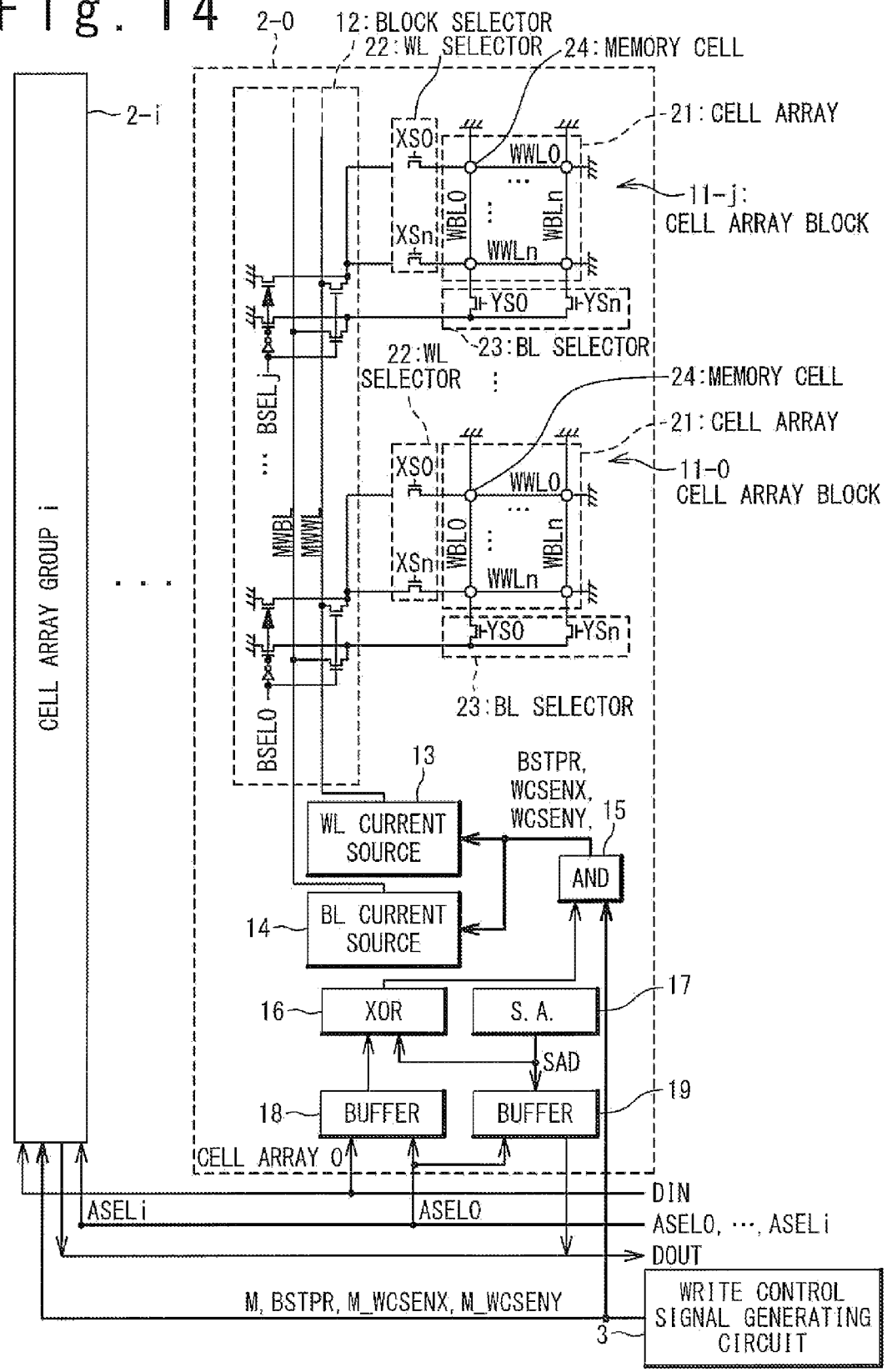
FIG. 14 is a block diagram showing a configuration of a MRAM according to second and third exemplary embodiments of the present invention.

A configuration of a MRAM according to a second exemplary embodiment of the present invention will be described below. FIG. 14 is a block diagram showing a configuration of a MRAM according to the second exemplary embodiment of the present invention. A MRAM 1 contains the plurality of cell array groups 2-0 to 2-i and a write control signal generating circuit 3. In this exemplary embodiment, the cell array group 2 is not divided into each system, differently from the first exemplary embodiment. However, the WL current source 13 and the BL current source 14 are changed. The MRAM1 is the same as the MRAM 101 described with reference to FIG. 6 except that configurations inside the WL current source 13 and the BL current source 14 are different.

That is, the write control signal generating circuit 3 corresponds to the write control signal generating circuit 103. The plurality of cell array groups 2-0 to 2-i corresponds to the plurality of cell array groups 102-0 to 102-I, respectively. The plurality of cell array blocks 11-0 to 11-j corresponds to the plurality of cell array blocks 111-0 to 111-j, respectively. The block selector 12 corresponds to the block selector 112. The AND circuit 15, the XOR circuit 16, the sense amplifier 17 and the buffer circuits 18, 19 correspond to the AND circuit 115, the XOR circuit 116, the sense amplifier 117 and the buffer circuits 118, 119, respectively. Here, the descriptions of the common portions are omitted.

Figure 15:
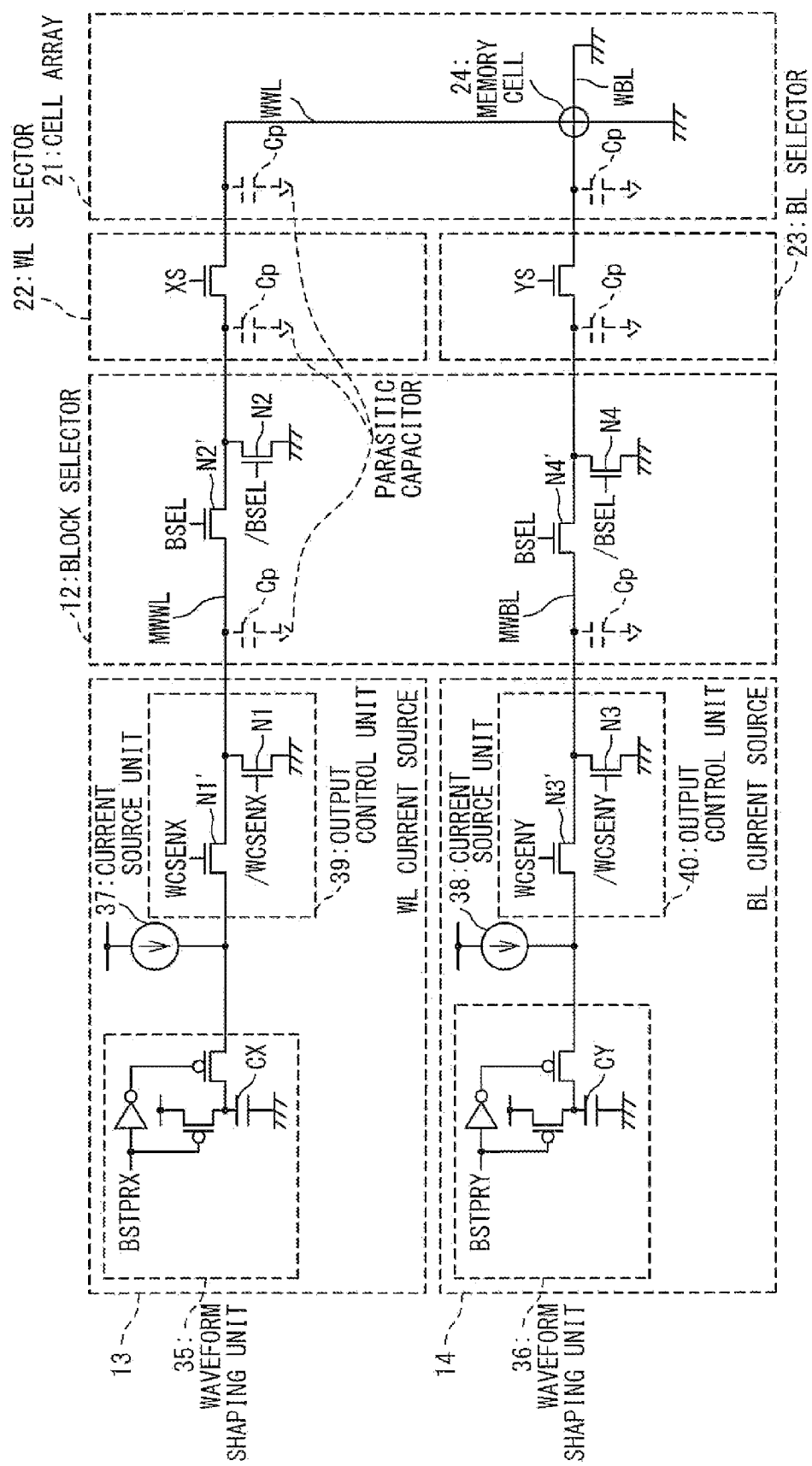
FIG. 15 is a circuit diagram showing a configuration of a portion through which a write current in FIG. 14 flows.

FIG. 15 is a circuit diagram showing a configuration of a portion through which the write current in FIG. 14 flows. The MRAM 1 in this exemplary embodiment differs from the MRAM 101 described with reference to FIG. 6 in that the pre-charge signal BSTPR is designed to be composed of the two systems of a signal BSTPRX for the write word line WWL and a signal BSTPRY for the write bit line WBL. That is, a waveform shaping unit 35 in the WL current source 13 charges the parasitic capacitors Cp of the current route (the main write word line MWWL+ the write word line WWL) with charges accumulated in the capacitor CX in the period while the signal BSTPRX is LOW. On the other hand, a waveform shaping unit 36 in the BL current source 14 charges the parasitic capacitors Cp of the current route (the main write bit line MWBL+ the write bit line WBL), with charges accumulated in the capacitor CY in the period while the signal BSTPRY different from the signal BSTPRX is LOW. Consequently, timings when the parasitic capacitors are charged and discharged can be controlled independently between the main write word line MWWL side and the main write bit line MWBL side.

Figure 16:
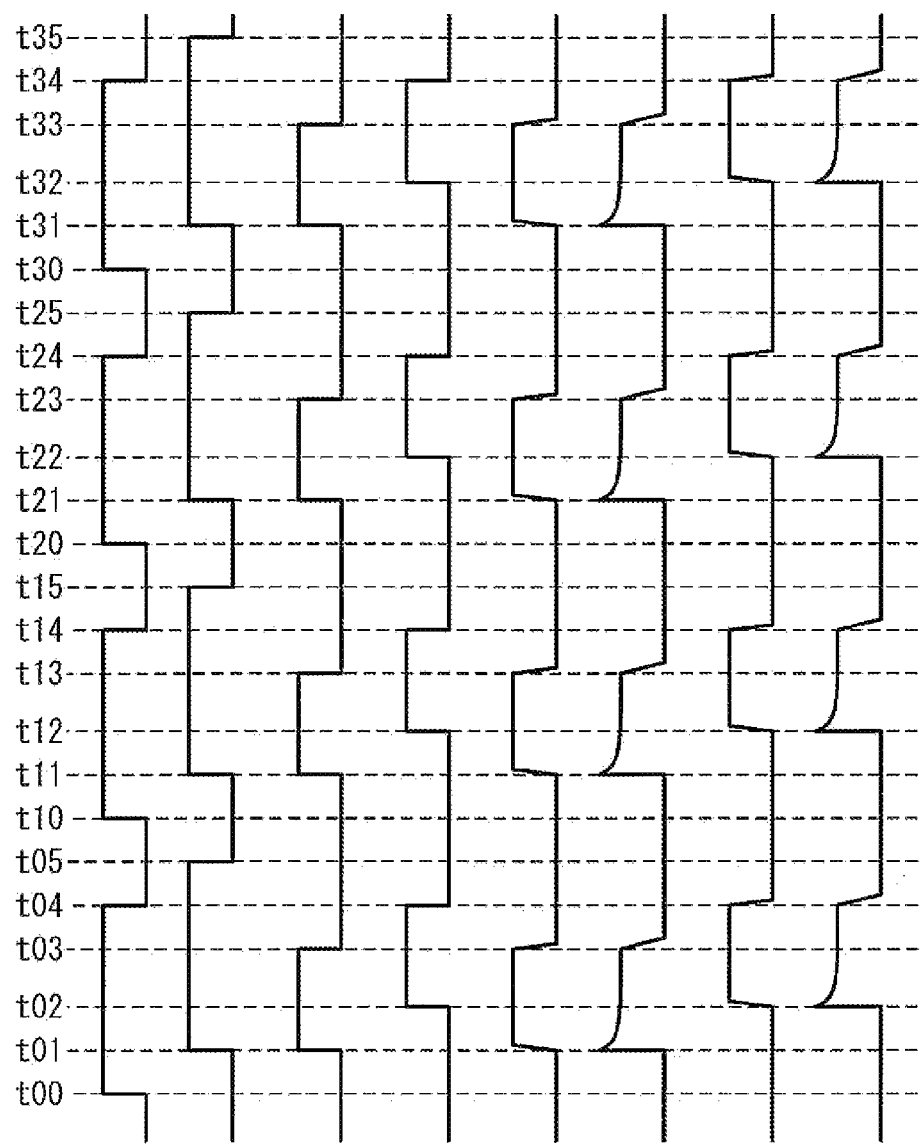
FIG. 16A to FIG. 16H are timing charts showing waveforms of control signals and currents.

FIG. 16A to FIG. 16H are timing charts showing waveforms of respective control signals and currents. FIG. 16A shows the signal BSTPRX. FIG. 16B shows the signal BSTPRY. FIG. 16C shows the signal WCSENX. FIG. 16D shows the signal WCSENY. FIG. 16E shows the write current IWWL on the write word line WWL. FIG. 16F shows the write current IWWL on the main write word line MWWL. FIG. 16G shows the write current IWBL on the write bit line WBL. FIG. 16H shows the write current IWBL on the main write bit line MWBL.

When the MRAM1 is a toggle MRAM, the write current IWWL and the write current IWBL are supplied to the cell array 21 while their timings are made different. Thus, in the waveform shaping unit 35 and the waveform shaping unit 36, at the different timings, charges are accumulated in the respective capacitors (CX, CY) and respective current routes (the main write word line MWWL+ the write word line WWL, the main write bit line MWBL+ the write bit line WBL) can be pre-charged. That is, in the WL current source 13 and the BL current source 14, while the period in which the pre-charge signal BSTPR is Low is secured, the interval of the pre-charge signals BSTPR can be made short. Also, the two write control signal generating circuits are not required to be installed, which can suppress the overhead in view of the area.

Here, with reference to FIG. 15 and FIG. 16A to FIG. 16R the writing operation of the burst mode is described. Here, an example of the write word line WWL0 in the cell array block 11-0 is indicated.

(1) t00

Among the memory cells on the write word line WWL0, the memory cell 24 on which the toggle write should be performed is already determined, based on the reading operation carried out immediately before the toggle write. Here, a case when the toggle write is performed on all of the memory cells 24 is described. When the last signal BSTPRX is Low, the capacitor CX is already charged. At the time t00, the signal BSTPRX becomes High (FIG. 16A), and discharging of charges accumulated in the capacitor CX is started. Wirings from the waveform shaping unit 35 to the output control unit 39 are charged. At this time, the block selection signal BSEL0 becomes High (not shown) and the cell array block 11-0 is selected by the block selector 12. The signal XS0 becomes High (not shown), and the write word line WWL0 is selected by the WL selector 22.

(2) t01

When the last signal BSTPRY is Low, the capacitor CY is already charged. At the time t01, the signal BSTPRY becomes High (FIG. 16B), and discharging of charges accumulated in the capacitor CY is started. Wirings from the waveform shaping unit 36 to the output control unit 40 are charged. At this time, the block selection signal BSEL0 is already High (not shown), and the cell array block 11-0 is already selected by the block selector 12. At this time, the signal YS0 becomes High (not shown), and the write bit line WBL0 is selected by the BL selector 23.

Simultaneously, the signal WCSENX becomes High (FIG. 16C), and the remainder of the charges accumulated in the capacitor CX charges the main write word line MWWL and the write word line WWL0. Together with it, the write current IWWL is supplied from the current source unit 37 to the main write word line MWWL and the write word line WWL0 (FIG. 16F, FIG. 16E). With this charging, the rising of the write current IWWL can be improved, thereby shaping the current waveform.

(3) t02

The signal WCSENY becomes High (FIG. 16D), and the remainder of the charges accumulated in the capacitor CY charges the main write bit line MWBL and the write bit line WBL0. Together with it, the write current IWBL is supplied from the current source unit 38 to the main write bit line MWBL and the write bit line WBL0 (FIG. 16H, FIG. 16G). With this charging, the rising of the write current IWBL can be improved, thereby shaping the current waveform.

(4) t03

The signal WCSENX becomes Low FIG. 16C), and the write current IWWL to the main write word line MWWL and the write word line WWL0 from the current source unit 137 is stopped (FIG. 16F, FIG. 16E).

(5) t04

The signal WCSENY becomes Low (FIG. 16D), and the write current IWBL to the main write bit line MWBL and the write bit line WBL0 from the current source unit 38 is stopped (FIG. 16H, FIG. 16G). Since this write current IWWL and the write current IWBL are supplied at a temporal difference, the toggle write can be performed on the selected memory cell 24.

Simultaneously, the signal BSTPRX becomes Low (FIG. 16A), and charges begin to be accumulated in the capacitor CX. Because of the writing operation of the burst mode, until the completion of the writing to the memory cells 24 in a predetermined range, the block selection signal BSEL0 is kept High (not shown), and the cell array block 11-0 is still selected by the block selector 12. Until the execution of the writing to all of the memory cells 24 on the write word line WWL0, the signal XS0 is kept High (not shown), and the write word line WWL0 is still selected by the WL selector 22.

(6) t05

At the time t05, the signal BSTPRY becomes Low (FIG. 16B), and charges begin to be accumulated in the capacitor CY. Because of the writing operation of the burst mode, until the completion of the writing to the memory cells 24 in the predetermined range, the block selection signal BSEL0 is kept High (not shown), and the cell array block 11-0 is still selected by the block selector 12.

The signal YS0 becomes Low (not shown), and the selection of the write bit line WBL0 by the BL selector 23 is completed.

Hereafter, the similar processes are repeated.

According to the present invention, the waveform shaping unit can be used to execute the writing operation at the higher speed.

Third Exemplary Embodiment

A configuration of a MRAM according to a third exemplary embodiment of the present invention will be described below. FIG. 14 is a block diagram showing a configuration of a MRAM according to the third exemplary embodiment of the present invention. The MRAM 1 includes the plurality of cell array groups 2-0 to 2-i and the write control signal generating circuit 3. This exemplary embodiment differs from the second exemplary embodiment in that the WL current source 13 and the BL current source 14 are changed. The MRAM1 is the same as the MRAM 101 described with reference to FIG. 6, except that configurations inside the WL current source 13 and the BL current source 14 are different. Thus, the descriptions of common portions are omitted.

Figure 17:
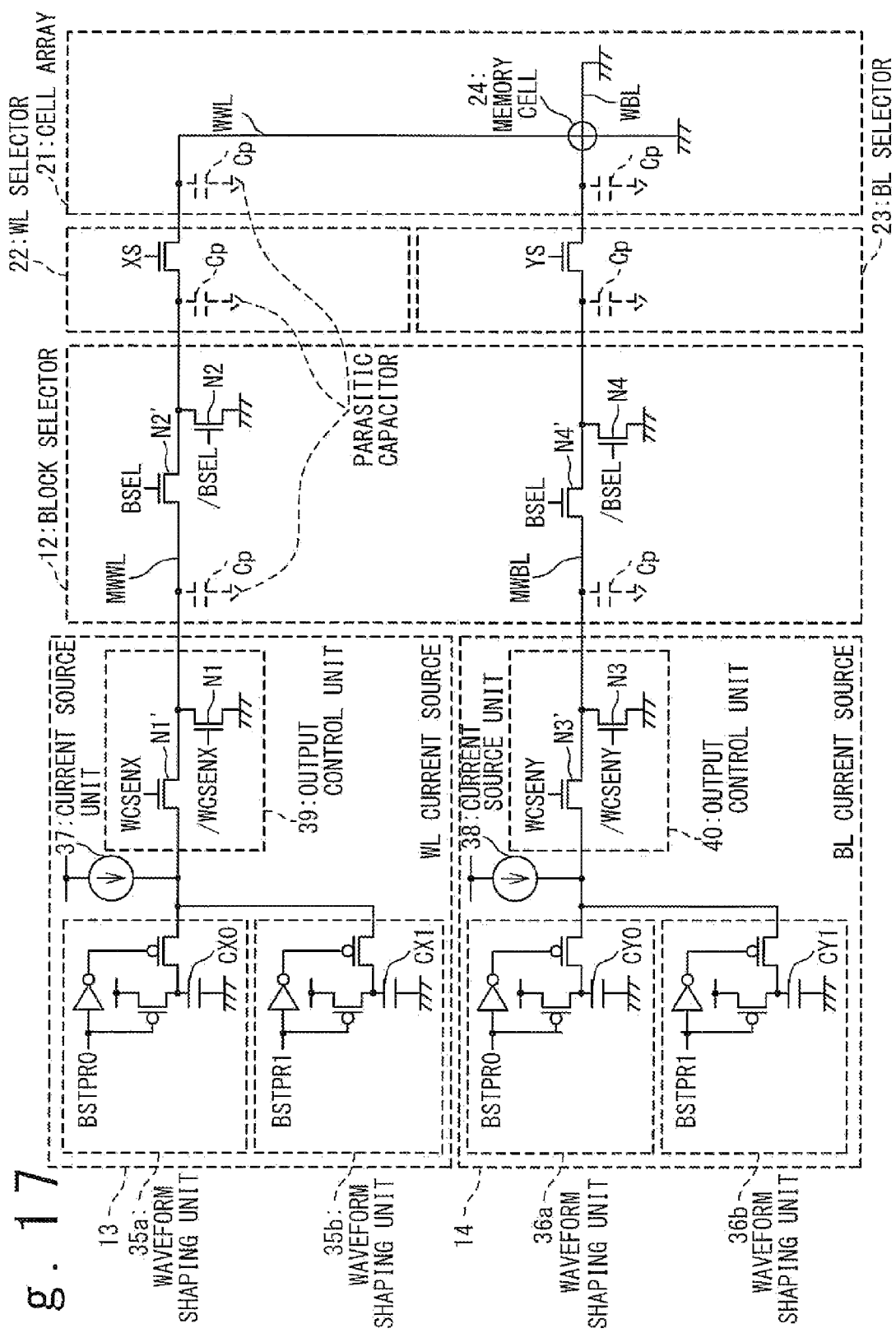
FIG. 17 is a circuit diagram showing a configuration of a portion through which a write current in FIG. 14 flows.

FIG. 17 is a circuit diagram showing a configuration of a portion through which the write current in FIG. 14 flows. The MRAM 1 in this exemplary embodiment differs from the MRAM 101 described with reference to FIG. 6, in that each waveform shaping unit is defined as two systems. That is, the WL current source 13 includes a waveform shaping unit 35a and a waveform shaping unit 35b. The waveform shaping unit 35a charges (pre-charges) the parasitic capacitors Cp of the current route (the main write word line MWWL+ the write word line WWL), with charges accumulated in a capacitor CX0 in the period while the signal BSTPR0 is LOW. On the other hand, the waveform shaping unit 35b charges the parasitic capacitors Cp of the current route, with charges accumulated in a capacitor CX1 in the period while the signal BSTPR1 is LOW. The waveform shaping unit 35a and the waveform shaping unit 35b pre-charge the current route alternately.

Similarly, the BL current source 14 includes a waveform shaping unit 36a and a waveform shaping unit 36b. The waveform shaping unit 36a charges (pre-charges) the parasitic capacitors Cp of the current route (the main write bit line MWBL+ the write bit line WBL) with charges accumulated in a capacitor CY0 in the period while the signal BSTPR0 is LOW. On the other hand, the waveform shaping unit 36b charges the parasitic capacitors Cp of the current route, with charges accumulated in a capacitor CY1 in the period while the signal BSTPR1 is LOW. The waveform shaping unit 36a and the waveform shaping unit 36b pre-charge the current route alternately.

FIG. 18A to FIG. 18H are timing charts showing waveforms of respective control signals and currents. FIG. 18A shows the signal BSTPR1. FIG. 18B shows the signal BSTPR0. FIG. 18C shows the signal WCSENX. FIG. 18D shows the signal WCSENY. FIG. 18E shows the write current IWWL on the write word line WWL. FIG. 18F shows the write current IWWL on the main write word line MWWL. FIG. 18G shows the write current IWBL on the write bit line WBL. FIG. 18H shows the write current IWBL on the main write bit line MWBL.

When the MRAM 1 is the toggle MRAM, the write current IWWL and the write current IWBL are supplied to the cell array 21, while their timings are made different. Thus, in the waveform shaping unit 35 and the waveform shaping unit 36, charges are accumulated in the respective capacitors (CX, CY) at the different timings, and the respective current routes (the main write word line MWWL+ the write word line WWL, the main write bit line MWBL+ the write bit line WBL) can be pre-charged. That is, in the WL current source 13 and the BL current source 14, while the period in which the pre-charge signal BSTPR is Low is secured, the interval of the pre-charge signals BSTPR can be made short. Also, the two write control signal generating circuits are not required to be installed, which can suppress the overhead in view of the area.

This control can be simply executed, as compared with the other exemplary embodiments.

Here, with reference to FIG. 17 and FIG. 18A to FIG. 18H, the writing operation of the burst mode is described. Here, the example of the write word line WWL0 of the cell array block 11-0 is described.

(1) t00

Among the memory cells on the write word line WWL0, the memory cell 24 on which the toggle write should be performed is already determined, based on the reading operation carried out immediately before the toggle write. Here, a case when the toggle write is performed on all of the memory cells 24 is described. When the last signal BSTPR0 is Low, the capacitors CX0 and CY0 are already charged. At the time too, the signal BSTPR0 becomes High (FIG. 18B), and discharging of charges accumulated in the capacitors CX0 and CY0 is started. Wirings from the waveform shaping unit 35a to the output control unit 39 and from the waveform shaping unit 36a to the output control unit 40 are charged. At this time, the block selection signal BSEL0 becomes High (not shown), and the cell array block 11-0 is selected by the block selector 12. The signal XS0 becomes High (not shown), and the write word line WWL0 is selected by the WL selector 22. The signal YS0 becomes High (not shown), and the write bit line WBL0 is selected by the BL selector 23.

(2) t01

The signal WCSENX becomes High (FIG. 18C), and the remainder of the charges accumulated in the capacitor CX0 charges the main write word line MWWL and the write word line WWL0. Together with it, the write current IWWL is supplied from the current source unit 37 to the main write word line MWWL and the write word line WWL0 (FIG. 18F, FIG. 18E). With this charging, the rising of the write current IWWL can be improved, thereby shaping the current waveform.

(3) t02

The signal WCSENY becomes High (FIG. 18D), and the remainder of the charges accumulated in the capacitor CY0 charges the main write bit line MWBL and the write bit line WBL0. Together with it, the write current IWBL is supplied from the current source unit 38 to the main write bit line MWBL and the write bit line WBL0 (FIG. 18H, FIG. 18G). With this charging, the rising of the write current IWBL can be improved, thereby shaping the current waveform.

(4) t03

The signal WCSENX becomes Low (FIG. 18C), and the write current IWWL from the current source unit 37 to the main write word line MWWL and the write word line WWL0 is stopped (FIG. 18F, FIG. 18E).

(5) t04

The signal WCSENY becomes Low (FIG. 18D), and the write current IWBL from the current source unit 38 to the main write bit line MWBL and the write bit line WBL0 is stopped (FIG. 18H FIG. 18G). Since this write current IWWL and the write current IWBL are supplied at the temporal difference, the toggle write can be performed on the selected memory cell 24.

(6) t05

At the time t05, the signal BSTPR0 becomes Low (FIG. 18B), and charges begin to be accumulated in the capacitors CX0 and CY0. Because of the writing operation of the burst mode, until the completion of the writing to the memory cells 24 in the predetermined range, the block selection signal BSEL0 is kept High (not shown), and the cell array block 11-0 is still selected by the block selector 12. Until the execution of the writing to all of the memory cells 24 on the write word line WWL0, the signal XS0 is kept High (not shown), and the write word line WWL0 is still selected by the WL selector 22. The signal YS0 becomes Low (not shown). Then, the selection of the write bit line WBL0 by the BL selector 23 is completed.

(7) t10

When the last signal BSTPR1 is Low, the capacitors CX1 and CY1 are already charged. At the time t10, the signal BSTPR1 becomes High (FIG. 18A), and discharging of charges accumulated in the capacitors CX1 and CY1 is started. The wirings from the waveform shaping unit 35b to the output control unit 39 and from the waveform shaping unit 36b to the output control unit 40 are charged. At this time, the block selection signal BSEL1 becomes High (not shown), and the cell array block 11-0 is selected by the block selector 12. The signal XS0 is High (not shown), and the write word line WWL0 is already selected by the WL selector 22. The signal YS1 becomes High (not shown), and the write bit line WBL1 is selected by the BL selector 23.

(8) t11

Figure 1:
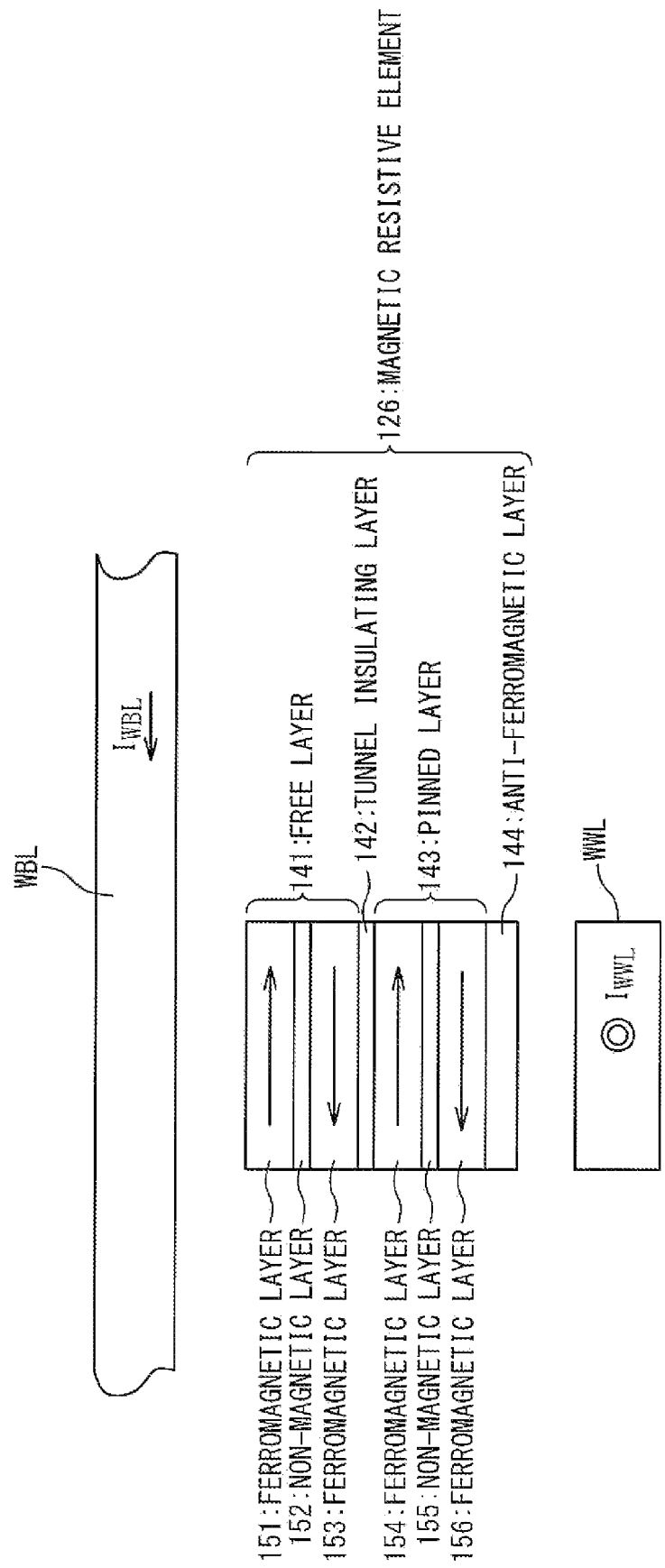
FIG. 1 is a sectional view showing a configuration of the convention magnetic resistive element.
Figure 2:
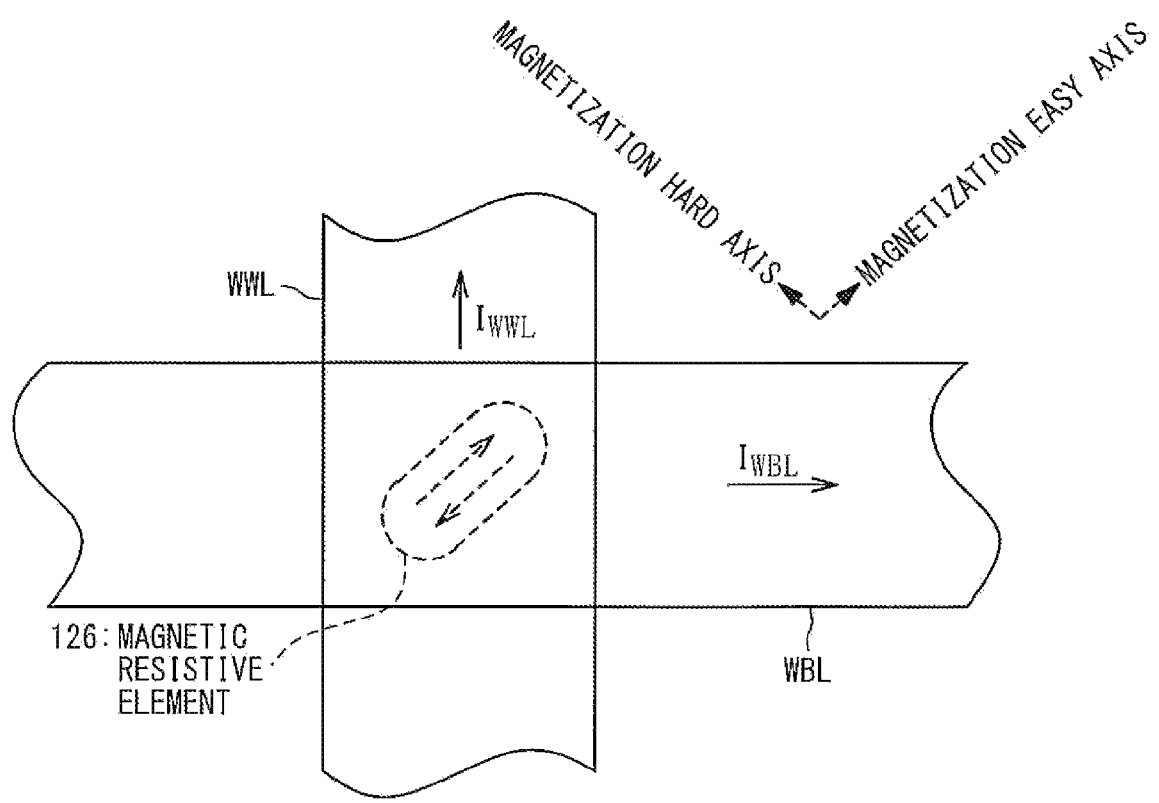
FIG. 2 is a top view showing a configuration of the convention magnetic resistive element.
Figure 3:
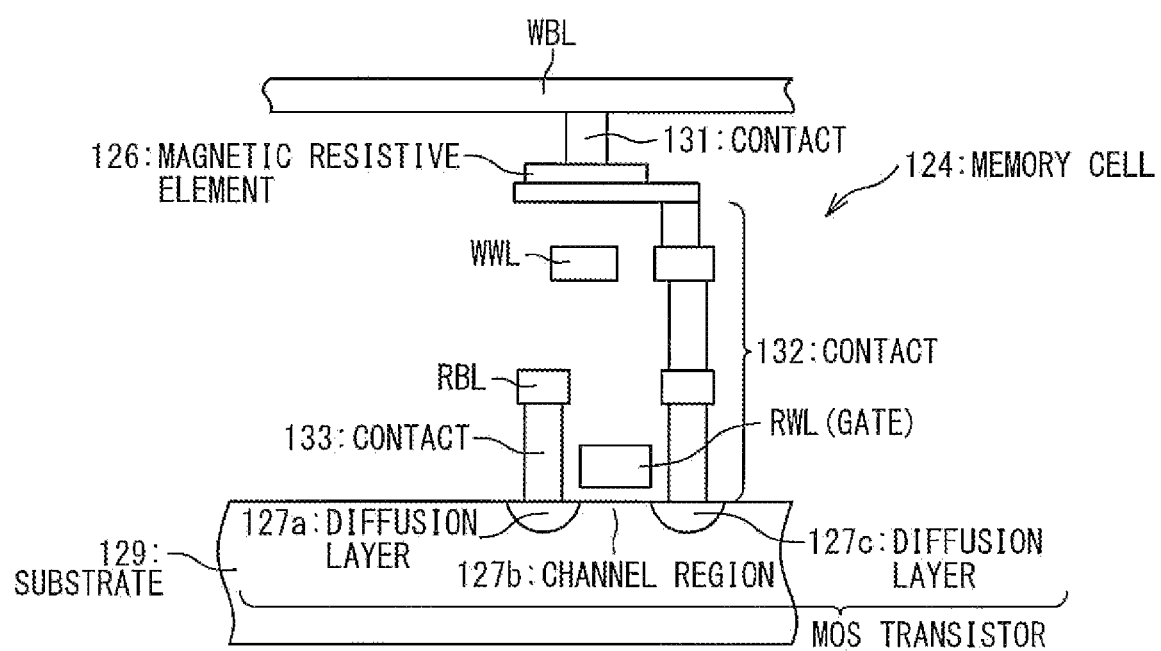
FIG. 3 is a sectional view showing a configuration of a memory cell including the conventional magnetic resistive element.
Figure 4:
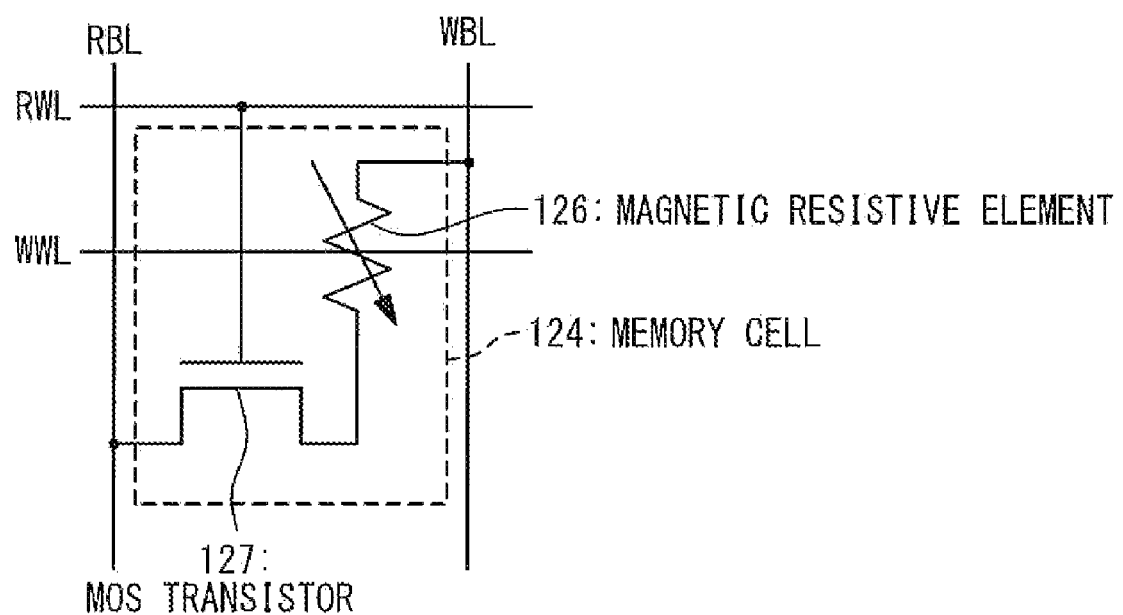
FIG. 4 is an equivalent circuit diagram showing the configuration shown in FIG. 3.
Figure 5A:
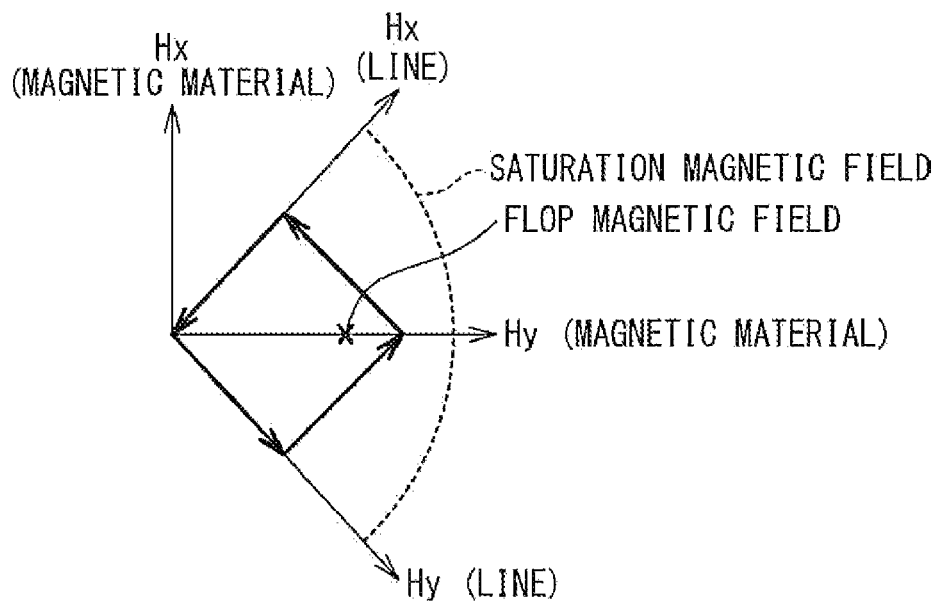
FIG. 5A is a graph showing a locus (selection cell) of a writing magnetic field induced by a write current.
Figure 5B:
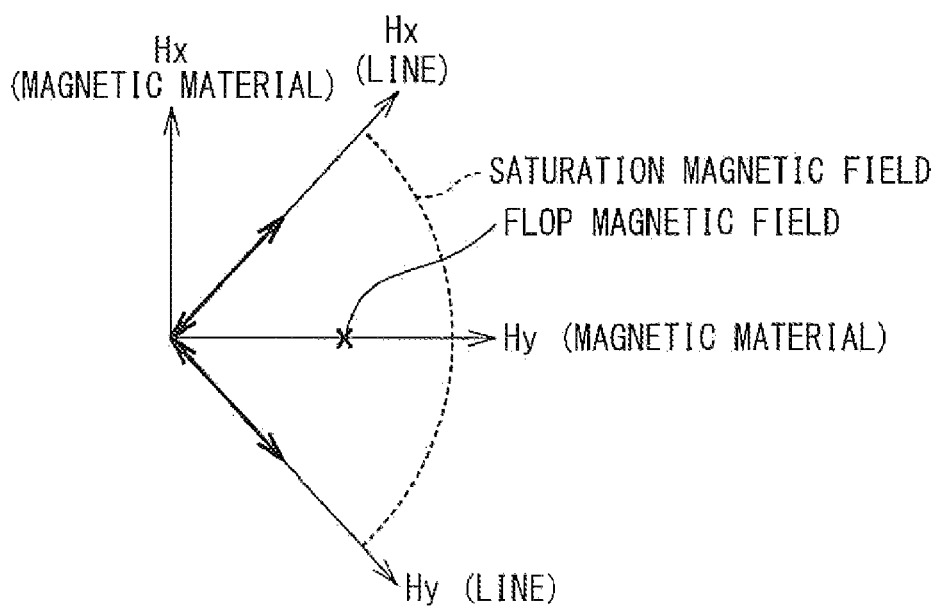
FIG. 5B is a graph showing a locus (non-selection cell) of the writing magnetic field induced by the write current.

The signal WCSENX becomes High (FIG. 18C), and the remainder of the charges accumulated in the capacitor CX1 charges the main write word line MWWL and the write word line WWL0. Together with it, the write current IWWL is supplied from the current source unit 37 to the main write word line MWWL and the write word line WWL0 (FIG. 18F, FIG. 1E). With this charging, the rising of the write current IWWL can be improved, thereby shaping the current waveform.

(9) t12

The signal WCSENY becomes High (FIG. 18D), and the remainder of the charges accumulated in the capacitor CY1 charges the main write bit line MWBL and the write bit line WBL1. Together with it, the write current IWBL is supplied from the current source unit 38 to the main write bit line MWBL and the write bit line WBL1 (FIG. 18H, FIG. 18G) With this charging, the rising of the write current IWBL can be improved, thereby shaping the current waveform.

(10) t13

The signal WNCSENX becomes Low (FIG. 18C), and the write current IWWL from the current source unit 37 to the main write word line MWWL and the write word line WWL0 is stopped (FIG. 18F, FIG. 18E).

(11) t14

The signal WCSENY becomes Low (FIG. 18D), and the write current IWBL from the current source unit 38 to the main write bit line MWBL and the write bit line WBL1 is stopped (FIG. 18H, FIG. 18G). Since this write current IWWL and the write current IWBL are supplied at the temporal difference, the toggle write can be performed on the selection cell 24.

(12) t15

At the time t15, the signal BSTPR1 becomes Low (FIG. 18A), and charges begin to be accumulated in the capacitors CX1 and CY1. Because of the writing operation of the burst mode, until the completion of the writing to the memory cells 24 in the predetermined range, the block selection signal BSEL0 is kept High (not shown), and the cell array block 11-0 is still selected by the block selector 12. Until the execution of the writing to all of the memory cells 24 on the write word line WWL0, the signal XS0 is kept High (not shown), and the write word line WWL0 is still selected by the WL selector 22. The signal YS1 becomes Low (not shown). Then, the selection of the write bit line WBL1 by the BL selector 23 is completed.

Hereafter, the similar processes are repeated.

According to the present invention, the waveform shaping unit can be used to carry out the writing operation at the higher speed.

Incidentally, the above-mentioned respective exemplary embodiments can be combined and used as long as the mutually technical conflict is not generated.

The present invention is not limited to the above-mentioned respective exemplary embodiments. It is clear that each exemplary embodiment can be properly modified and changed within the range of the technical idea of the present invention.

The invention claimed is:

1. A magnetic random access memory comprising:
   a first cell array group including a plurality of cell arrays; and
   a second cell array group including a plurality of cell arrays,
   wherein each of said first cell array group and said second cell array group includes:
   a first current source unit supplying a first write current to a bit line of each of said plurality of cell arrays, and
   a first current waveform shaping unit including a first capacitor required to be pre-charged and shaping a waveform of said first write current,
   wherein at a time of a writing operation of a magnetic memory cell in said each cell array, said first current waveform shaping unit in said first cell array group and said first current waveform shaping unit in said second cell array group charge and discharge charges accumulated in said first capacitor to and from a wiring towards said bit line in periods different from each other.

2. The magnetic random access memory according to claim 1, wherein each of said first cell array group and said second cell array group further includes:
   a second current source unit supplying a second write current to a word line of said each cell array, and
   a second current waveform shaping unit including a second capacitor required to be pre-charged and shaping a waveform of said second write current,
   wherein at a time of said writing operation of said magnetic memory cell, said second current waveform shaping unit in said first cell array group and said second current waveform shaping unit in said second cell array group charge and discharge charges accumulated in said second capacitor to and from a wiring towards said bit line in periods different from each other.

3. The magnetic random access memory according to claim 2, wherein said magnetic memory cell includes:
   a free layer with a synthetic ferrimagnet structure,
   wherein said magnetization easy axis direction of said free layer is inclined at about 45 degrees for said direction of said bit line.

4. The magnetic random access memory according to claim 1, wherein said magnetic memory cell includes:
   a free layer with a synthetic ferrimagnet structure,
   wherein said magnetization easy axis direction of said free layer is inclined at about 45 degrees for said direction of said bit line.

5. A magnetic random access memory comprising:
   a first current source unit shared in a plurality of cell arrays and supplying a first write current to each bit line in said plurality of cell arrays;

a first current waveform shaping unit including a first capacitor required to be pre-charged and shaping a waveform of said first write current;

a second current source unit shared in said plurality of cell arrays and supplying a second current to each word line in said plurality of cell arrays; and a second current waveform shaping unit including a second capacitor required to be pre-charged and shaping a waveform of said second write current, wherein at a time of a writing operation of a magnetic memory cell, a period while said first current waveform shaping unit carries out charging and discharging to and from said first capacitor for a wiring towards said bit line and a period while said second current waveform shaping unit carries out charging and discharging to and from said second capacitor for a wiring towards said word line are different from each other.

6. The magnetic random access memory according to claim 5, wherein said magnetic memory cell includes:

a free layer with a synthetic ferrimagnet structure, wherein said magnetization easy axis direction of said free layer is inclined at about 45 degrees for said direction of said bit line.

7. A magnetic random access memory comprising:

a first current source unit shared in a plurality of cell arrays and supplying a first write current to each bit line in said plurality of cell arrays;

a first current waveform shaping unit including a first capacitor required to be pre-charged and shaping a waveform of said first write current; and a third current waveform shaping unit including a third capacitor required to be pre-charged and shaping a waveform of said first write current, wherein at a time of a writing operation of a magnetic memory cell in said each cell array, a period while said first current waveform shaping unit charges and discharges charges accumulated in said first capacitor to and from said wiring towards said bit line and a period while said third current waveform shaping unit charges and discharges charges accumulated in said third capacitor to and from a wiring towards said bit line are different front each other.

8. The magnetic random access memory according to claim 7, further comprising:

a second current source unit shared in said plurality of cell arrays and supplying said second write current to each word line in said plurality of cell arrays;

a second current waveform shaping unit including a second capacitor required to be pre-charged and shaping a waveform of said second write current; and a fourth current waveform shaping unit including a fourth capacitor required to be pre-charged and shaping a waveform of said second write current, wherein at said time of said writing operation of said magnetic memory cell in said each cell array, a period while said second current waveform shaping unit charges and discharges charges accumulated in said second capacitor to and from a wiring towards said word line and a period while said fourth current waveform shaping unit charges and discharges charges accumulated in said fourth capacitor to and from a wiring towards said word line are different from each other.

9. The magnetic random access memory according to claim 8, wherein said magnetic memory cell includes:

a free layer with a synthetic ferrimagnet structure, wherein said magnetization easy axis direction of said free layer is inclined at about 45 degrees for said direction of said bit line.

10. The magnetic random access memory according to claim 7, wherein said magnetic memory cell includes:

a free layer with a synthetic ferrimagnet structure, wherein said magnetization easy axis direction of said free layer is inclined at about 45 degrees for said direction of said bit line.

11. An operating method of a magnetic random access memory, wherein said magnetic random access memory includes:

a first cell array group including a plurality of cell arrays, and a second cell array group including a plurality of cell arrays, wherein each of said first cell array group and said second cell array group includes:

a first current source unit supplying a first write current to a bit line of each of said plurality of cell arrays, and a first current waveform shaping unit including a first capacitor required to be pre-charged and shaping a waveform of said first write current, wherein said operating method of said magnetic random access memory comprises:

(a) at a time of a writing operation of said magnetic memory cell in said each cell array, said first current waveform shaping unit in said first cell array group discharging charges accumulated in said first capacitor to a wiring towards said bit line in a first period; and (b) said first current waveform shaping unit in said second cell array group discharging charges accumulated in said first capacitor to a wiring towards said bit line in a second period different from said first period.

12. The operating method of the magnetic random access memory according to claim 11, wherein in said magnetic random access memory, each of said first cell array group and said second cell array group further includes:

a second current source unit supplying a second write current to said word line of said each cell array, and a second current waveform shaping unit including a second capacitor required to be pre-charged and shaping a waveform of said second write current, wherein said operating method of the magnetic random access memory further comprises:

(c) at said time of said writing operation of said magnetic memory cell, said second current waveform shaping unit in said first cell array group discharging charges accumulated in said second capacitor to a wiring towards said word line in a third period; and (d) said second current waveform shaping unit in said second cell array group discharging charges accumulated in said second capacitor to a wiring towards said word line in a fourth period different from said third period.

13. The operating method of said magnetic random access memory according to claim 12, wherein said writing operation of said magnetic memory cell is the toggle write operation.

14. The operating method of said magnetic random access memory according to claim 11, wherein said writing operation of said magnetic memory cell is the toggle write operation.

15. An operating method of a magnetic random access memory, wherein said magnetic random access memory includes:
- a first current source unit shared in a plurality of cell arrays and supplying a first write current to each bit line in said plurality of cell arrays,
- a first current waveform shaping unit including a first capacitor required to be pre-charged and shaping a waveform of said first write current,
- a second current source unit shared in said plurality of cell arrays and supplying a second write current to each word line in said plurality of cell arrays, and
- a second current waveform shaping unit including a second capacitor required to be pre-charged and shaping a waveform of said second write current, wherein said operating method of said magnetic random access memory comprises:
- (a) at a time of a writing operation of a magnetic memory cell, said first current waveform shaping unit discharging charges accumulated in said first capacitor in a first period to a wiring towards said bit line; and
- (b) said second current waveform shaping unit discharging charges accumulated in said second capacitor in a second period different from said first period to a wiring towards said bit line.

16. The operating method of said magnetic random access memory according to claim 15, wherein said writing operation of said magnetic memory cell is the toggle write operation.

17. An operating method of a magnetic random access memory, wherein said magnetic random access memory includes:
- a first current source unit shared in a plurality of cell arrays and supplying a first write current to each bit line in said plurality of cell arrays,
- a first current waveform shaping unit including a first capacitor required to be pre-charged and shaping a waveform of said first write current, and
- a third current waveform shaping unit including a third capacitor required to be pre-charged and shaping a waveform of said first write current, wherein said operating method of said magnetic random access memory comprises:
- (a) at a time of a writing operation of a magnetic memory cell in said each cell array, said first current waveform shaping unit discharging charges accumulated in said first capacitor in a first period to a wiring towards said bit line; and
- (b) said third current waveform shaping unit discharging charges accumulated in said third capacitor to a wiring towards said bit line in a third period different from said first period.

18. The operating method of the magnetic random access memory according to claim 17, wherein said magnetic random access memory further includes:
- a second current source unit shared in said plurality of cell arrays and supplying a second write current to each word line in said plurality of cell arrays,
- a second current waveform shaping unit including a second capacitor required to be pre-charged and shaping a waveform of said second write current, and
- a fourth current waveform shaping unit including a fourth capacitor required to be pre-charged and shaping a waveform of said second write current, wherein said operating method of said magnetic random access memory further comprises:
- (a) at said time of said writing operation of said magnetic memory cell in said each cell array, said second current waveform shaping unit discharging charges accumulated in said second capacitor in a second period to a wiring towards said word line; and
- (b) said fourth current waveform shaping unit discharging charges accumulated in said fourth capacitor to a wiring towards said word line in a fourth period different from said second period.

19. The operating method of said magnetic random access memory according to claim 18, wherein said writing operation of said magnetic memory cell is the toggle write operation.

20. The operating method of said magnetic random access memory according to claim 17, wherein said writing operation of said magnetic memory cell is the toggle write operation.

* * * * *